United States Patent
Konishi

(10) Patent No.: US 7,053,350 B2
(45) Date of Patent: May 30, 2006

(54) AUTOFOCUS CONTROL APPARATUS AND METHOD

(75) Inventor: Kazuki Konishi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/225,049

(22) Filed: Sep. 14, 2005

(65) Prior Publication Data

US 2006/0006308 A1    Jan. 12, 2006

Related U.S. Application Data

(63) Continuation of application No. 10/750,187, filed on Dec. 30, 2003, now Pat. No. 6,979,808.

(30) Foreign Application Priority Data

Jun. 5, 2003    (JP)    ............................. 2003-160986

(51) Int. Cl.
*H04N 5/232*    (2006.01)

(52) U.S. Cl. .................................... 250/201.2; 348/348

(58) Field of Classification Search .. 250/201.2–201.8; 348/348, 354, 207.99; 396/98, 100, 121, 396/77

See application file for complete search history.

(56) References Cited

U.S. PATENT DOCUMENTS 5,703,351 A    12/1997    Meyers .................... 250/201.2
6,686,966 B1    2/2004    Hashimoto .................. 348/348

FOREIGN PATENT DOCUMENTS

| JP | 5-119250 | 5/1993 |
| JP | 2000-111792 | 4/2000 |
| JP | 2000-184260 | 6/2000 |

*Primary Examiner*—Thanh X. Luu
*Assistant Examiner*—Tony Ko
(74) *Attorney, Agent, or Firm*—Morgan & Finnegan, LLP

(57) ABSTRACT

Provided is an autofocus control apparatus in an image sensing apparatus which includes: an optical system including a focus lens; a solid-state image sensing device that photoelectrically converts light incident via the optical system into image signals and outputs the image signals; and a focus drive motor that drives the focus lens to adjust a focus position, the autofocus control apparatus comprising: a light-emitting section; and a focus position detector that performs focus position detection according to an active system and focus position detection according to a passive system on the basis of the image signals obtained from the image sensing unit.

10 Claims, 14 Drawing Sheets

FIG. 6

|   |   |   |   |   |   |   |   |   |
|---|---|---|---|---|---|---|---|---|
| R | G | R | G | R | G | R | G | R |
| G | B | G | B | G | B | G | B | G |
| R | G | R | G | R | G | R | G | R |
| G | B | G | B | G | B | G | B | G |
| R | G | R | G | R | G | R | G | R |
| G | B | G | B | G | B | G | B | G |
| R | G | R | G | R | G | R | G | R |
| G | B | G | B | G | B | G | B | G |
| R | G | R | G | R | G | R | G | R |

AUTOFOCUS CONTROL APPARATUS AND METHOD

This is a continuation of prior application Ser. No. 10/750,187, filed on Dec. 30, 2003, now U.S. Pat No. 6,979,808, which is incorporated herein by reference in its entirety.

FIELD OF THE INVENTION

The present invention relates to an autofocus control apparatus and method, and more specifically, to an autofocus control apparatus and method which perform focus control using image signals acquired by an image sensing device that photoelectrically converts an optical image of an object formed by an image sensing optical system.

BACKGROUND OF THE INVENTION

Conventionally, there is an autofocus control apparatus that performs focus control using image signals acquired by an image sensing element that photoelectrically converts an optical image of an object formed by an image sensing optical system.

As such an autofocus control apparatus, there has been proposed an autofocus control apparatus that uses both an autofocus system employing contrast detection and an autofocus system employing infrared ray detection, and performs a focusing operation which uses the autofocus system employing contrast detection at the time of a normal image sensing operation and, on the other hand, switches to the autofocus system employing infrared ray detection only under an image sensing environment in which the focusing operation according to the autofocus system employing contrast detection is difficult, to thereby perform a distance measurement operation and an autofocus operation with respect to a desired subject. With such an apparatus, appropriate autofocus can be performed regardless of brightness of a subject (e.g., see Japanese Patent Laid-Open No. 5-119250).

In addition, as another autofocus control apparatus, there has been proposed an autofocus control apparatus that uses both an autofocus system employing contrast detection, which photoelectrically converts an optical image of an object to generate image signals and detects a predetermined high-frequency component from the generated image signals to thereby perform focusing, and an autofocus system using a light-emitting unit (LED) irradiating an infrared ray and infrared ray detection, which receives reflected light from an object to detect an output signal corresponding to a distance to the object, and selects at least one of the autofocus system employing contrast detection and the autofocus system employing infrared ray detection on the basis of an output from a temperature detection device which detects environment temperature to thereby perform an autofocus operation. According to this autofocus control apparatus, appropriate autofocus can be performed regardless of a change in environment temperature when the apparatus is in use (e.g., see Japanese Patent Laid-Open No. 2000-111792).

However, in the above-described conventional examples, at least one of the autofocus system employing contrast detection and the autofocus system employing infrared ray detection is selected according to brightness of a subject or environment temperature when an apparatus is in use to perform an autofocus operation.

Consequently, there is a disadvantage that it is necessary to separately provide an autofocus device employing infrared ray detection in addition to an image sensing device for photoelectrically converting an object image formed by an image sensing optical system, which leads to an increase in cost. In addition, in the case in which one of the autofocus systems is selected to perform an autofocus operation, there is a disadvantage that a high-speed and high-precision autofocus operation cannot be performed.

SUMMARY OF THE INVENTION

The present invention has been devised in view of the above situation, and it is an object of the present invention to realize a highly accurate autofocus function at low cost.

According to the present invention, the foregoing object is attained by providing an autofocus control apparatus in an image sensing apparatus that comprises: an optical system including a focus lens; an image sensing unit that photoelectrically converts light incident via the optical system into image signals and outputs the image signals; and a drive unit that drives the focus lens to adjust a focus position, the autofocus control apparatus comprising: a floodlighting unit; and a focus position detector that performs focus position detection according to an active system and focus position detection according to a passive system on the basis of the image signals obtained from the image sensing unit.

According to the present invention, the foregoing object is also attained by providing an autofocus control method in an image sensing apparatus that comprises: an optical system including a focus lens; an image sensing unit that photoelectrically converts light incident via the optical system into image signals and outputs the image signals; and a floodlighting unit, the autofocus control method comprising: performing focus position detection according to an active system on the basis of the image signals obtained from the image sensing unit; and performing focus position detection according to a passive system on the basis of the image signals obtained from the image sensing unit.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a diagram showing an example of arrangement of color filters;

DETAILED DESCRIPTION OF THE PREFERRED EMBODIMENTS

Preferred embodiments of the present invention will be described in detail in accordance with the accompanying drawings.

First Embodiment

Figure 1:
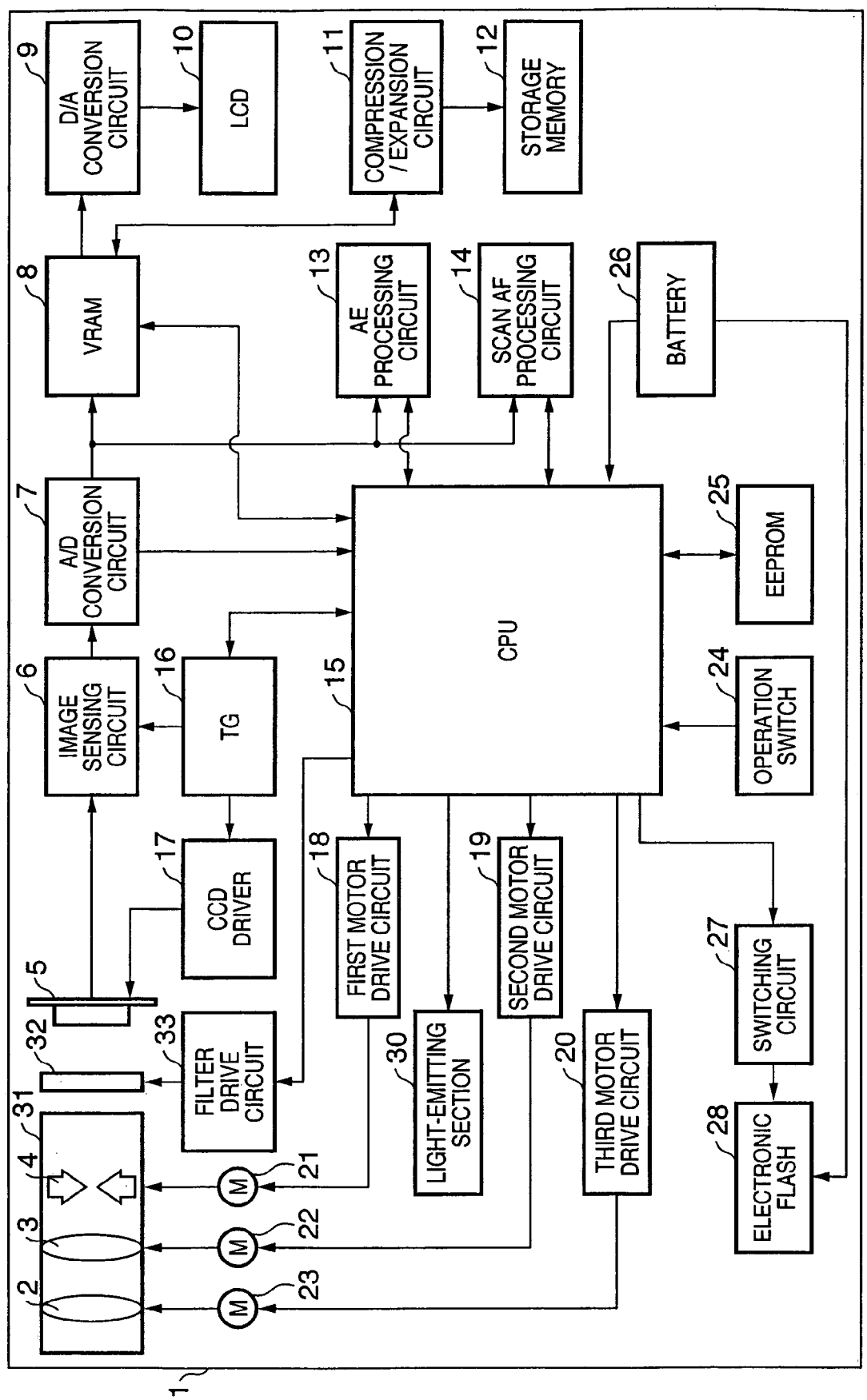
FIG. 1 is a block diagram showing a schematic structure of an image sensing apparatus according to a first embodiment of the present invention.

FIG. 1 is a block diagram showing an example of a schematic structure of an image sensing apparatus according to a first embodiment of the present invention. The image sensing apparatus includes, for example, a digital still camera and a digital video camera but is not limited to these cameras. It is possible to apply the present invention to any image sensing apparatus as long as the image sensing apparatus acquires an incident optical image as an electrical image by photoelectric conversion using a solid-state image sensing device, such as an area sensor, whose pixels are arranged two-dimensionally.

In FIG. 1, reference numeral 1 denotes an image sensing apparatus; 2, a group of zoom lenses; 3, a group of focus lenses; 4, a stop serving as a light amount adjusting unit and an exposure unit that controls an amount of light beams transmitted through an image sensing optical system including the group of zoom lenses 2, the group of focus lenses 3, and the like; 31, a lens-barrel including the group of zoom lenses 2, the group of focus lenses 3, the stop 4, and the like; 5, a solid state image sensing device such as a CCD (hereinafter referred to as "CCD") on which an image of an object transmitted through the image sensing optical system is formed and that photoelectrically converts the transmitted image; 6, an image sensing circuit that receives electric signals photoelectrically converted by the CCD 5 and applies various kinds of image processing to the electric signals to thereby generate image signals of a predetermined form; 7, an A/D conversion circuit that converts analog image signals generated by the image sensing circuit 6 into digital image signals; 8, a memory such as a buffer memory (VRAM) that temporarily stores the digital image signals outputted from the A/D conversion circuit 7; 9, a D/A conversion circuit that reads out image signals stored in the VRAM 8 to convert the image signals into analog signals and converts the same into image signals of a form suitable for reproduction and output; 10, an image display device such as a liquid crystal display device (LCD) (hereinafter referred to as LCD) that displays the image signals; 12, a storage memory, which stores image data, comprising a semiconductor memory or the like; and 11, a compression/expansion circuit including a compression circuit, which reads out the image signals temporarily stored in the VRAM 8 and applies compression processing and coding processing of image data in order to change the image signals to a form suitable for storage in the storage memory 12, and an expansion circuit, which applies decoding processing and expansion processing for changing the image data stored in the storage memory 12 to a form optimal for performing reproduction, display, and the like of the image data.

In addition, reference numeral 13 denotes an AE processing circuit that receives an output from the A/D conversion circuit 7 and performs automatic exposure (AE) processing; 14, a scan AF processing circuit that receives an output from the A/D conversion circuit 7 and performs autofocus (AF) processing; 15, a CPU incorporating a memory for arithmetic operation for controlling the image sensing device; 16, a timing generator (hereinafter referred to as TG) that generates a predetermined timing signal; 17, a CCD driver; 21, a stop drive motor that drives the stop 4; 18, a first motor drive circuit that controls to drive the stop drive motor 21; 22, a focus drive motor that drives the group of focus lenses 3; 19, a second motor drive circuit that controls to drive the focus drive motor 22; 23, a zoom drive motor that drives the group of zoom lenses 2; and 20, a third motor drive circuit that controls to drive the zoom drive motor 23.

Moreover, reference numeral 24 denotes an operation switch including various groups of switches; 25, an EEPROM serving as an electrically writable read-only memory in which a program for performing various kinds of control, data to be used for causing the apparatus to perform various operations are stored in advance; 26, a battery; 28, an electronic flash; 27, a switching circuit that controls emission of flash of the electronic flash 28; 30, a light-emitting section for irradiating a light beam of infrared rays to an object including a floodlighting lens and a light-emitting device such as a light-emitting diode; 32, an iR cut filter that blocks an infrared ray; and 33, a filter drive circuit for inserting and retracting the iR cut filter 32 in front of the CCD 5.

Note that, as the storage memory serving as a storage medium for image data and the like, various forms of memories may be applied. Those include, inter alia, a stationary semiconductor memory such as a flash memory, a semiconductor memory such as a card type flash memory that is formed in a card shape or a stick shape and is formed to be detachable attachable to the apparatus, and a magnetic storage medium such as a hard disk or a floppy disk.

As the operation switch 24, there are a main power supply switch for starting the image sensing apparatus 1 and supplying power, a release switch that starts an image sensing operation (storage operation), a reproduction switch that starts a reproduction operation, a zoom switch that instructs to move the group of zoom lenses 2 of the image sensing optical system to perform zooming.

The release switch is constituted by two step switches including a first stroke (hereinafter referred to as SW1), which generates an instruction signal for starting AE processing and AF processing to be performed prior to an image sensing operation, and a second stroke (hereinafter referred to as SW2), which generates an instruction signal for starting an actual exposure operation.

Next, an operation of the image sensing apparatus in the first embodiment having the above-described structure will be described.

First, a light beam from an object, which has been transmitted through the groups of lenses 2 and 3 in the lens-barrel 31 of the image sensing apparatus 1, is formed on a light-receiving surface of the CCD 5 after a light amount thereof is adjusted by the stop 4. This optical image of the object is converted into electric signals by photoelectric conversion processing by the CCD 5 to be outputted to the image sensing circuit 6. The image sensing circuit 6 applies various kinds of signal processing to the inputted signals to generate image signals. These image signals are outputted to the A/D conversion circuit 7 and converted into digital signals (image data), and then temporarily stored in the VRAM 8.

The image data stored in the VRAM 8 is outputted to the D/A conversion circuit 9, converted into analog signals, and converted into image signals of a form suitable for display, and is then displayed as an image on the LCD 10. On the other hand, the image data stored in the VRAM 8 is also outputted to the compression/expansion circuit 11. After subjected to compression processing by the compression circuit in the compression/expansion circuit 11, the image data is converted into image data of a form suitable for storage and stored in the storage memory 12.

In addition, for example, when a not-shown reproduction switch in the operation switch 24 is turned on, a reproduction operation is started. Then, the image data, which is stored in the storage memory 12 in the compressed form, is outputted to the compression/expansion circuit 11 and subjected to decoding processing, expansion processing, or the like in the expansion circuit, and is then outputted to the VRAM 8 to be temporarily stored. Moreover, this image data is outputted to the D/A conversion circuit 9 and converted to analog signals, and converted into image signals of a form suitable for display, and is then displayed as an image on the LCD 10.

On the other hand, the image data digitized by the A/D conversion circuit 7 is also outputted to the AE processing circuit 13 and the scan AF processing circuit 14 when being outputted to the VRAM 8. In the AE processing circuit 13, in response to the inputted digital image signals, arithmetic operation processing such as cumulative addition and the like is applied to a luminance value of image data of one frame. Consequently, an AE evaluation value corresponding to brightness of the subject is calculated. This AE evaluation value is outputted to the CPU 15.

In the scan AF processing circuit 14, in response to the inputted digital image signals, a high-frequency component of image data of one frame is extracted via a high-pass filter (HPF) or the like, and arithmetic operation processing such as cumulative addition or the like is further performed. Consequently, an AF evaluation value corresponding to an amount of contour component on a high-frequency side is calculated. In this way, the scan AF processing circuit 14 acts as a part of a high-frequency component detection unit which detects a predetermined high-frequency component from the image signals generated by the CCD 5 in a course of performing the AF processing.

A predetermined timing signal is outputted to the CPU 15, the image sensing circuit 6, and the CCD driver 17 from the TG 16, and the CPU 15 performs various kinds of control in synchronization with this timing signal. In addition, in response to the timing signal from the TG 16, the image sensing circuit 6 performs various kinds of image processing such as color signal separation or the like in synchronization with the timing signal. Moreover, in response to the timing signal from the TG 16, the CCD driver 17 drives the CCD 5 in synchronization with the timing signal.

The CPU 15 controls the first motor drive circuit 18, the second motor drive circuit 19, and the third motor drive circuit 20, respectively, to thereby control to drive the stop 4, the group of focus lenses 3, and the group of zoom lenses 2 via the stop drive motor 21, the focus drive motor 22, and the zoom drive motor 23. In other words, the CPU 15 controls the first motor drive circuit 18 on the basis of the AE evaluation value or the like calculated in the AE processing circuit 13 to drive the stop drive motor 21 and performs AE control for adjusting the stop 4 such that a stop value becomes appropriate. Further, the CPU 15 performs AF control for controlling the second motor drive circuit 19 on the basis of the AF evaluation value calculated by the scan AF processing circuit 14 and an output obtained by an active AF unit to be described later to drive the focus drive motor 22 and move the group of focus lenses 3 to a focus position. In the case in which a not-shown zoom switch in the operation switch 24 is operated, in response to the operation, the CPU 15 controls the third motor drive circuit 20 to drive the zoom motor 23 to thereby move the group of zoom lenses 2 and perform a magnification operation (zoom operation) of the image sensing optical system.

Figure 2:
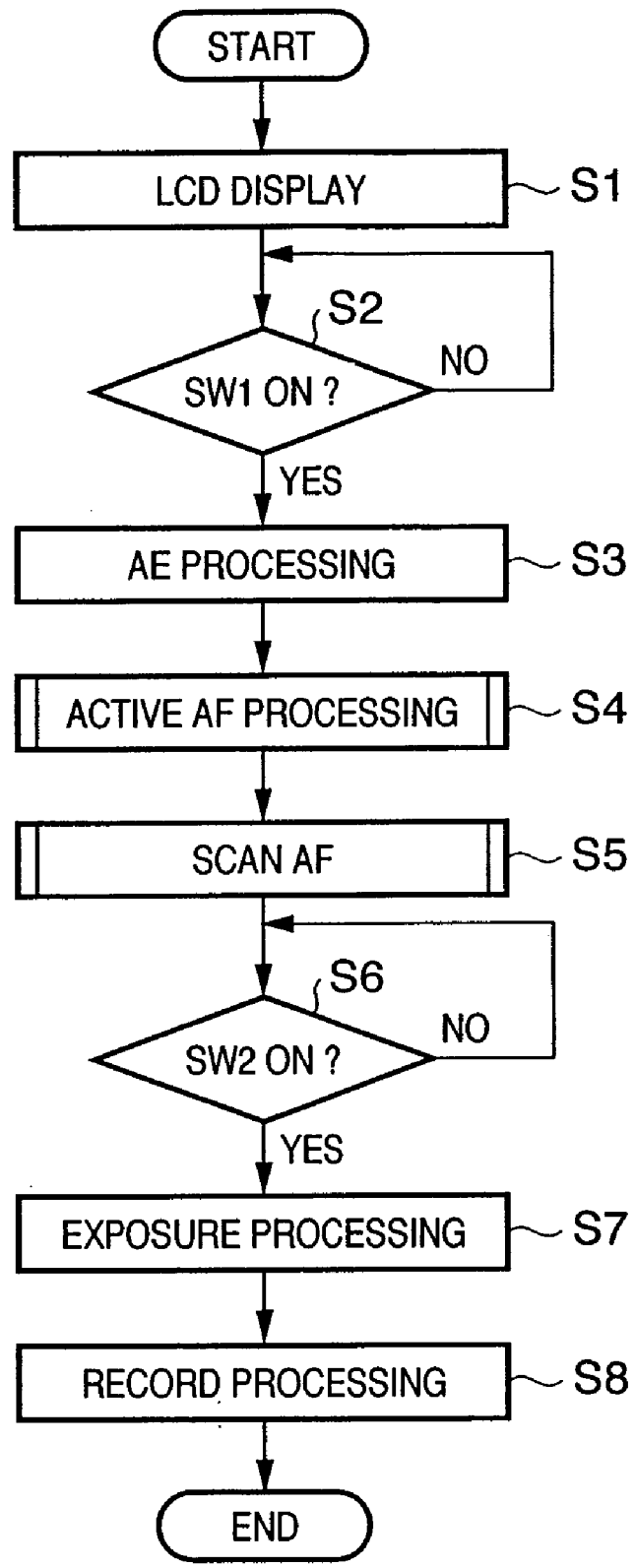
FIG. 2 is a flowchart showing an image sensing operation of the image sensing apparatus according to the first embodiment of the present invention.

Next, an image sensing operation of the image sensing apparatus 1 will be described using a flowchart shown in FIG. 2.

When a main power switch of the image sensing apparatus 1 is ON and an operation mode of the image sensing apparatus 1 is in an image sensing (recording) mode, an image sensing processing sequence is executed.

First, in step S1, as described above, the CPU 15 displays an optical image of an object, which is transmitted through the lens-barrel 31 and formed on the CCD 5, as an image on the LCD 10 via the image sensing circuit 6, the A/D conversion circuit 7, the VRAM, and the D/A conversion circuit 9.

Subsequently, in step S2, the CPU 15 confirms a state of the release switch. When the release switch is operated by a user and the CPU 15 confirms that the SW1 (first stroke of the release switch) is turned ON, the CPU 15 proceeds to the next step S3, and normal AE processing is executed. Then, in step S4, the CPU 15 performs active AF processing. The active AF processing is for detecting a rough distance to a desired object (focus position of the group of focus lenses 3) and is AF processing so-called coarse adjustment. The active AF processing will be described in detail later.

After the active AF processing, in step S5, the CPU 15 performs scan AF processing (or passive AF) for fine tuning for detecting an accurate focus position. In the scan AF processing, the CPU 15 performs the fine tuning for detecting an accurate focus position while moving the group of focus lenses 3 within a predetermined range around a found focus position. Details of the scan AF processing will also be described later.

When the predetermined AF processing ends in this way, in step S6, the CPU 15 confirms the state of the SW2 (second stroke of the release switch). If the SW2 is ON, the process proceeds to step S7 and the CPU 15 executes actual exposure processing. Then, in step S8, the CPU 15 stores an image obtained by exposure in the storage memory 12 via the CCD 5, the image sensing circuit 6, the A/D conversion circuit 7, the VRAM 8, and the compression/expansion circuit 11 as described above.

Next, details of the active AF processing executed in step S4 will be described with reference to FIG. 3.

First, in step S20, the CPU 15 drives the filter drive circuit 33 to retract the iR cut filter 32 from the front of the CCD 5 so as not to attenuate an infrared ray component that is attenuated at the time of image sensing. This is because an infrared light-emitting device is used as a light-emitting section 30 for the active AF processing since reflectance of an infrared ray on various objects is more stable than a normal ray and good distance measurement can be expected.

Subsequently, in step S21, the CPU 15 performs charge accumulation with the light-emitting section 30 on. The CPU 15 causes the light-emitting section 30 to emit light to irradiate an infrared ray to the object. At the same time, the CPU 15 adjusts an amount of light to be received by the CCD 5 with the stop 4. More specifically, the CPU 15 performs control such that the stop 4 is narrowed and an amount of light emission of the light-emitting section 30 is increased when it is bright and the stop 4 is opened and the amount of light emission of the light-emitting section 30 is reduced when it is dark. The incident optical image of the object is converted into electric signals by the photoelectric conversion processing of the CCD 5 and outputted to the image sensing circuit 6.

Next, in step S22, the CPU 15 controls the image sensing circuit 6 and reads out only a part of the output signals corresponding to a central part of the CCD 5 (hereinafter referred to as "detection area"). Then, in step S23, after outputting the read-out output signals to the A/D conversion circuit 7 and converting it into digital signals (image data), the CPU 15 stores the digital signals in a memory incorporated therein. The digital signals are stored in the memory incorporated in the CPU 15 because an amount of data is small, since only a part of the image data from the CCD 5 has to be stored here. In addition, high-speed processing can also be realized by reading out only the part of the image data in this way.

Then, the process proceeds to step S24 and the CPU 15 performs charge accumulation with the light-emitting section 30 off with the same stop as at the time of the charge accumulation with the light-emitting section 30 on in step S21. The optical image of the object formed on the light receiving surface of the CCD 5 is converted into electric signals by the photoelectric conversion processing of CCD 5 and outputted to the image sensing circuit 6 (step S25). The image sensing circuit 6 applies various kinds of signal processing to the inputted signal to generate image signals. The image signals are outputted to the A/D conversion circuit 7 and converted into digital signals (image data), and are then temporarily stored in the VRAM 8 (step S26). Then, the digital signals are outputted to the D/A conversion circuit 9, converted into analog signals, and converted into image signals of a form suitable for display, and are then displayed as an image on the LCD 10.

The process proceeds to step S27 and the CPU 15 performs an external light eliminating operation. Here, the CPU 15 finds differences between image data of the charge accumulation with the light-emitting section 30 on and image data of the charge accumulation with the light-emitting section 30 off to thereby find data (object) of a reflected image that is obtained as the infrared ray irradiated by the light-emitting section 30 is reflected on the object. Since a component of an image formed by external light can be removed, it becomes easy to find a center of the reflected image. Practically, the CPU 15 reads data of a part corresponding to the image data stored in the memory incorporated in the CPU 15 among the image data stored in the VRAM 8 and calculates differences between the read image data and the image data stored in the memory incorporated in the CPU 15 to thereby remove external light components. An arithmetic operation result (differential data) with the external light eliminated in this way is stored in the memory incorporated in the CPU 15.

Subsequently, in step S28, the CPU 15 calculates a center of gravity of the reflected image using the differential data calculated in step S27. Here, the CPU 15 extracts an object with a relatively high luminance having steep leading and trailing edges in the differential data and finds a center of gravity of the extracted object.

Detection of an object is performed using signal values of one line that are found by adding a plurality of lines of differential data. Note that, in the case in which the surface of the CCD 5 is covered by a color filter for color separation, only signal values corresponding to a color filter with highest sensitivity to an infrared ray (red in a primary color filter) are used. Consequently, since it becomes unnecessary to correct sensitivity of each color component of a color filter for an infrared ray as in the case in which all pixels are used, uncertainty due to sensitivity correction can be avoided and processing can be performed at high speed.

Figure 4:
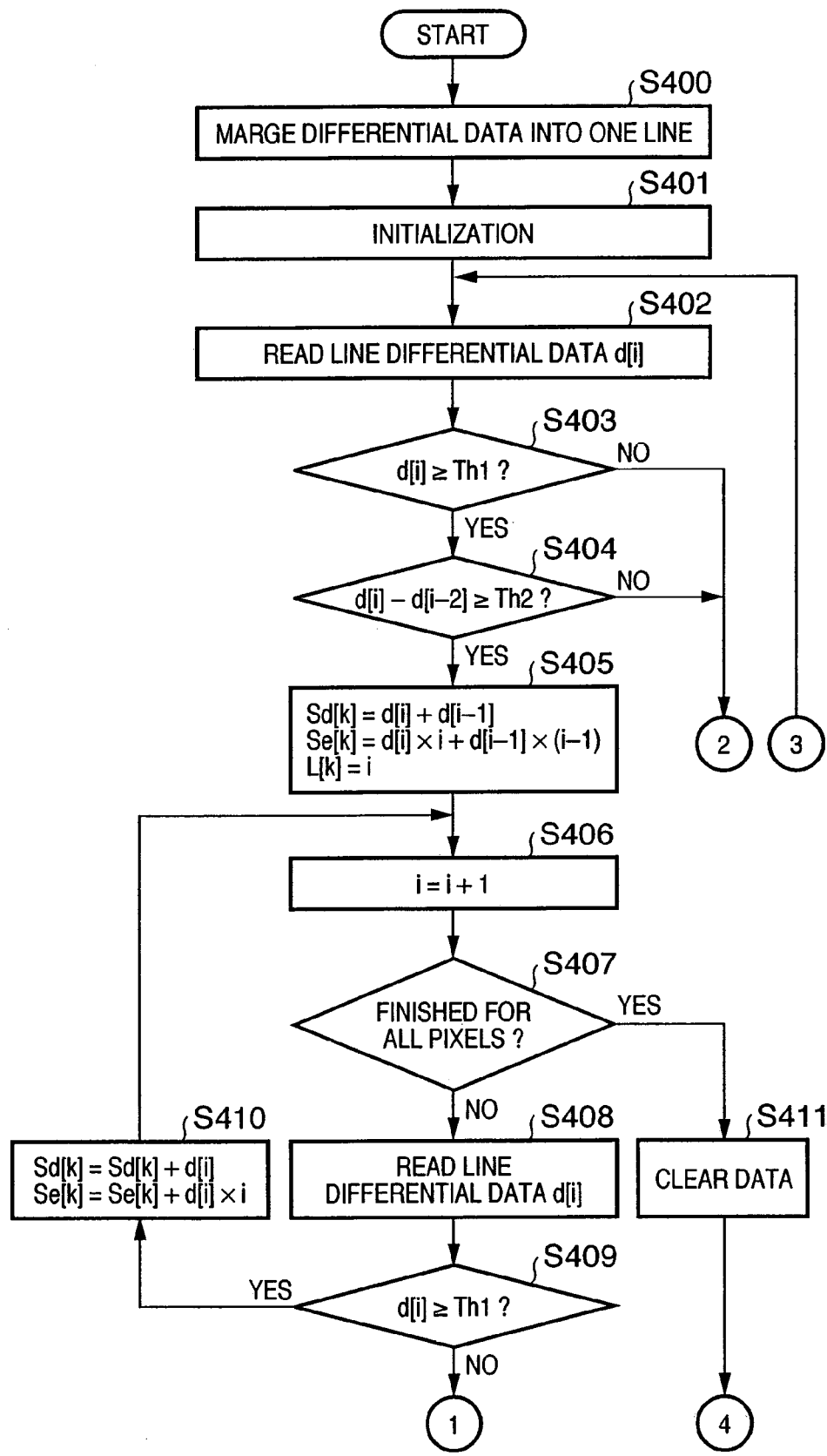
FIG. 4 is a flowchart explaining object detection processing in the active AF according to the first embodiment of the present invention.
Figure 5:
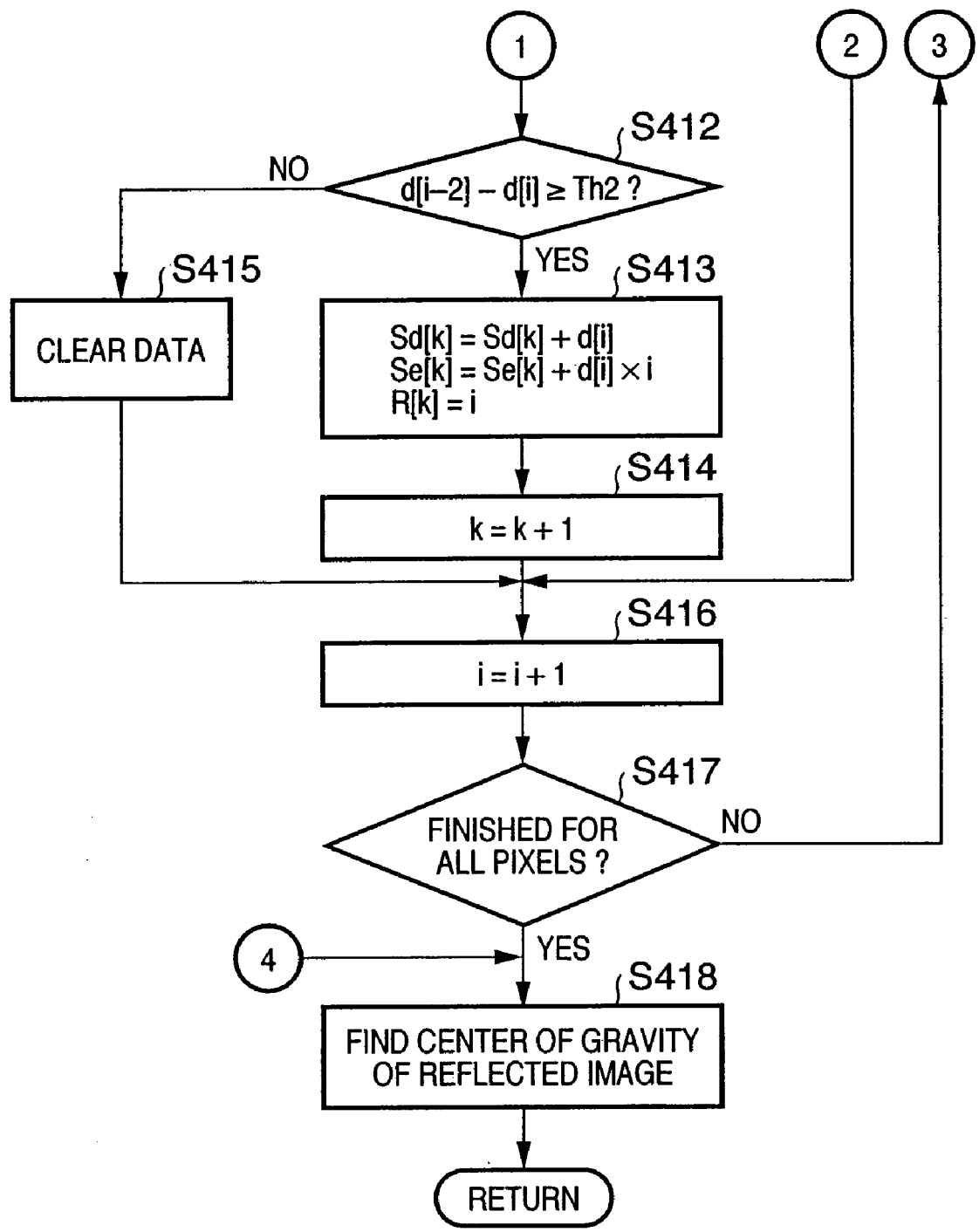
FIG. 5 is a flowchart explaining the object detection processing in the active AF according to the first embodiment of the present invention.

Here, details of the processing for finding a center of gravity of an object performed in step S28 will be described with reference to FIGS. 4 and 5.

First, in step S400, the plurality of lines of differential data are merged into one line.

Here, in the case in which a filter color arrangement for color separation covering the CCD 5 is a color arrangement as shown in FIG. 6, pixels corresponding to red are arranged in every other row and in ever other pixel. Thus, the plurality of lines are merged into one line as described below.

First, a differential data value of a j-th pixel of an L-th row is represented as a[L, j]. In addition, it is assumed that an i-th signal value of data for object detection arranged in one line is d[i]. In the case in which a positional relation between a detection area of the CCD 5 read in step S22 (area indicated by hatch lines in FIG. 6) and a filter arrangement are as shown in FIG. 6, since a filter corresponding to red exists in in odd number pixels of odd number rows, d[i] can be represented as $$d[i] = \sum_m a[2m-1, 2i-1].$$

A range of m is from 1 to ½ of the number of rows in the detection area (decimals are raised to the next whole number). In other words, addition is performed from a first row (m=1) until the number of 2m−1 becomes equal to the number of the detection area (in the case in which the number of rows is an odd number) or to the number of rows of the detection area −1 (in the case in which the number of rows is an even number). In addition, a range of i is from 1 to ½ of the number of pixels in a horizontal direction of the detection area (decimals are raised to the next whole number). In other words, addition is performed from a first pixel (i=1) until 2i−1 becomes equal to the number of pixels in the horizontal direction of the detection area (in the case in which the number of pixels is an odd number) or to the number of pixels of the detection area −1 (in the case in which the number of pixels is an even number).

For example, in the case in which seven rows form the detection area in the active AF as shown in FIG. 6, a first pixel of added lines into a single line is represented as follows:

$$d[1]=a[1,1]+a[3,1]+a[5,1]+a[7,1].$$

In this way, data obtained by external light elimination stored in the incorporated memory is merged into data of a single line, and the detection of an object is performed after storing the result of merging the data (hereinafter referred to as "line differential data").

Note that the above arithmetic equations are applied to the case shown in FIG. 6 and is required to be changed appropriately according to an arrangement of color filters or a position of a detection area on the CCD 5.

Next, in step S401, the CPU 15 performs initialization of variables used in an arithmetic operation and initialization of a work area of a memory. Here, the CPU 15 clears a work area in which counters i and k and data of an object are to be stored. In addition, since a plurality of objects may be detected, a plurality of memory areas for an arithmetic operation are prepared in which data of the objects is stored.

Next, in step S402, the CPU 15 reads out the line differential data stored in the memory incorporated in the CPU 15 in order. Here, each data is represented as d[i]. Then, in step S403, the CPU 15 compares d[i] with a first threshold value Th1. If d[i] is equal to or more than the first threshold value Th1, in step S404, the CPU 15 calculates a difference between d[i] and line differential data of a pixel that is away from the pixel of d[i] by a plurality of pixels (e.g., two pixels), and checks if the difference is equal to or more than a second threshold value Th2. If the difference is equal to or more than the second threshold value Th2, since it can be judged as a leading edge of an object (i.e., a left end of the object), the process proceeds to step S405 and various data of this object is stored in the memory incorporated in the CPU 15. Consequently, an object with a relatively high luminance having steep leading edge has been detected. On the other hand, if the condition is not satisfied in step S403 or S404, the process proceeds to step S416 in FIG. 5.

In step S405, the CPU 15 finds a sum of luminance d[i] of signals and a sum of products of luminance of signals and coordinates, d[i]×i, as data of the object and stores the sums. In addition, the CPU 15 stores i as L[k] as the coordinate of the left end of the object. Now, when it is assumed that a sum of luminance of a k-th object is Sd[k] and a sum of products of luminance and coordinates is Se[k], the following equations are used.

$$Sd[k]=d[i]+d[i-1]$$

$$Se[k]=d[i]\times i+d[i-1]\times(i-1)$$

Next, in step S406, the CPU 15 increments the counter i by one to set the next pixel as a subject of processing. In the next step S407, the CPU 15 judges if the processing has been finished for all the pixels of the line differential data. If the processing has been finished, the process proceeds to step S411, and if the processing has not been finished, the process proceeds to step S408. In step S408, the CPU 15 reads out the next line differential data d[i]. Then, in step S409, the CPU 15 compares d[i] with the first threshold value Th1. If d[i] is equal to or more than the first threshold value Th1, the CPU 15 judges that the object still continues, and proceeds to step S410 and updates the data of the object in accordance with the following equations.

$$Sd[k]=Sd[k]+d[i]$$

$$Se[k]=Se[k]+d[i]\times i$$

The CPU 15 performs these processes for updating data of the object until the condition of step S409 are not satisfied while updating the counter i in step S406. However, if the detection for all the pixels is finished while these processes are continued (YES in step S407), since the condition of trailing edge is not satisfied, the CPU 15 judges that the object currently detected is inappropriate, clears the data of the object in step S411, and the process immediately proceeds to step S418.

If the condition of step S409 is not satisfied (if d[i] is not equal to or more than the first threshold value Th1), since it can be judged that the object has ended, the CPU 15 checks whether or not the object has a steep trailing edge. In step S412, the CPU 15 calculates a difference between d[i] and line differential data of a pixel that is away from the pixel of d[i] by a plurality of pixels (e.g., two pixels), finds inclination at the trailing edge of the object, and checks if the declination is equal to or more than the second threshold value Th2. If the declination at the trailing edge of the object is equal to or more than the second threshold value Th2, since an object with a relatively high luminance having steep leading and trailing edges has been extracted, the process proceeds to step S413 and the CPU 15 updates the data of the object in accordance with the following equations.

$$Sd[k]=Sd[k]+d[i]$$

$$Se[k]=Se[k]+d[i]\times i$$

Moreover, the CPU 15 stores i in R[k] as the coordinate of the right end of the object. Then, the CPU 15 increments the counter k by one (step S414) and updates an address of the memory storing the data of the object. On the other hand, if the condition is not satisfied in step S412, since an object with a relatively high luminance having steep leading and trailing edges has not been extracted, the CPU 15 clears the data of the object that has been stored to that point (step S415).

Then, the process proceeds to step S416 and the CPU 15 increments the counter i by one to set the next pixel as a subject of an arithmetic operation, and then, in step S417, checks whether or not detection for all the pixels has been finished.

If the detection for all the pixels has been finished, in step S418, the CPU 15 finds a center of gravity of the detected object. The coordinate Px of the center of gravity of the object is calculated as follows.

$$Px=Se[k]/Sd[k]$$

When a plurality of objects have been detected, the CPU 15 selects object/objects for which R[k]−L[k] is within a predetermined range. This is because, since a size of a reflected image of a light-emitting section 30 on the CCD 5 should be substantially fixed, only reflected image/images falling within a fixed range anticipating an error is/are considered to be correct reflected image/images of the light-emitting section 30. In the case in which a plurality of objects still remain, an object for which a value of Sd[k]/(R[k]−L[k]) is the largest is selected. This is because, since the external light elimination has been performed for the object, it is considered that a luminance of a reflected image of a light-emitting section 30 becomes the maximum.

Figure 3:
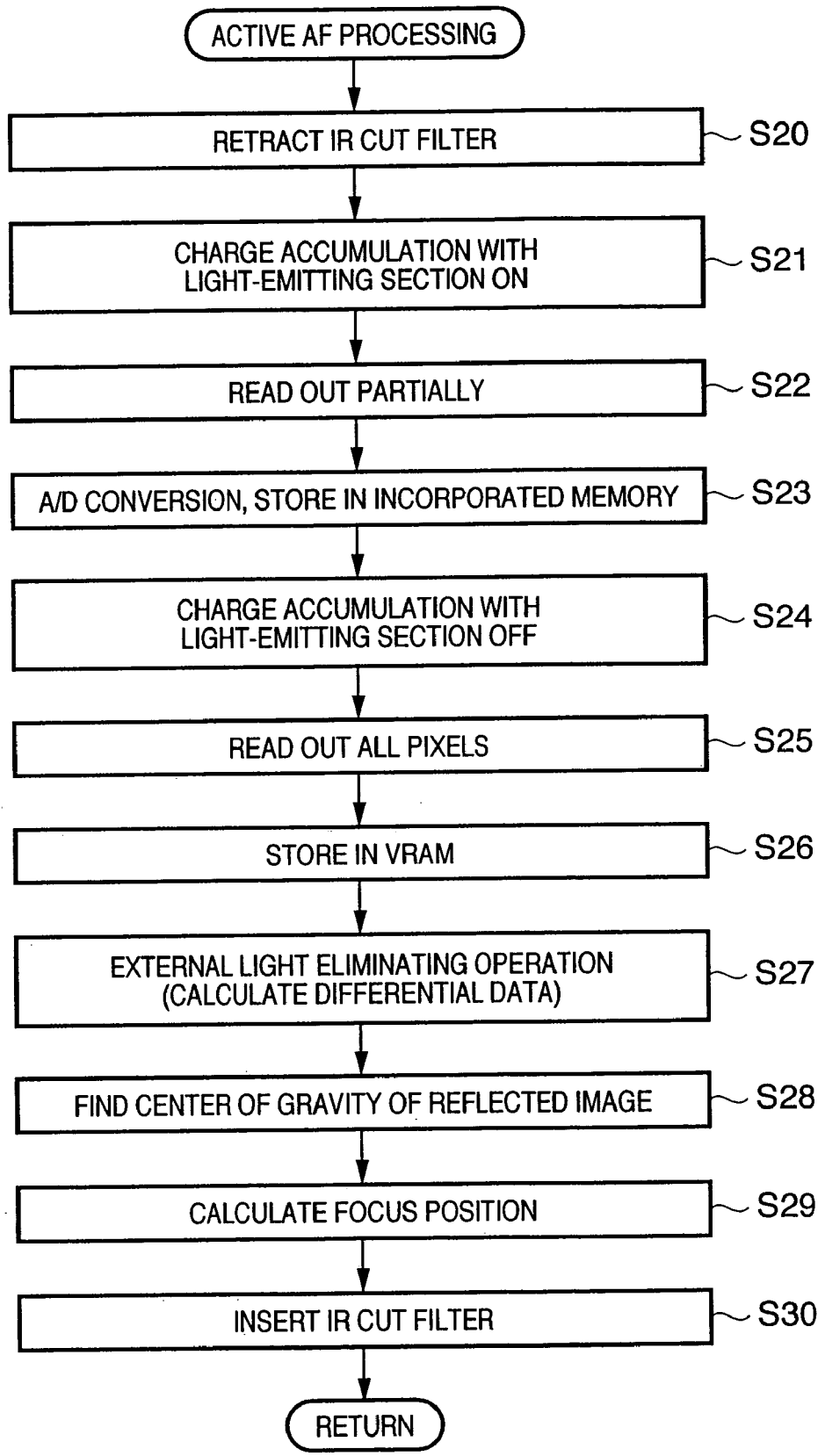
FIG. 3 is a flowchart explaining processing of active AF according to the first embodiment of the present invention.

After finding the center of the gravity of the reflected image in step S28 of FIG. 3 as described above, in step S29, the CPU 15 finds a distance to the object to be sensed on the basis of a position of the center of gravity. A distance L to the object is found as follows based on the principle of triangulation:

$$L=(f+\Delta z)\times B/x.$$

Here, f is a focal length of an image sensing lens, Δz is an extension amount of the image sensing lens, B is a baseline length (interval between an optical axis of the light-emitting section 30 and an optical axis of the image sensing lens), and x is a deviation amount from a center of an optical axis of the reflected image. Then, the CPU 15 finds a value indicating a position of the group of focus lenses 3 corresponding to this distance L and sets it as a focus position G1 of the active AF.

In addition, if a center of gravity of the reflected image is not found in step S28, since it is anticipated that the object is in the distance and an intensity of the reflected image is small, the CPU 15 sets a starting point of a detection operation for a focus position by the scan AF processing to infinity and sets a focus position of the active AF as a value found by subtracting a variable Gs from infinity.

Note that it is also possible to repeat the processing from steps S21 to S29 plural times and set an average of the obtained focus positions as a focus position of the active AF.

Thereafter, the process proceeds to step S30 and the CPU 15 inserts the iR cut filter 32, which has been retracted from the front of the CCD 5 in step S20, in front of the CCD 5 again.

Then, as described above, in step S5, the CPU 15 moves the group of focus lenses 3 to the vicinity of the focus position which has been found as a result of the distance measurement of the active AF processing.

Next, details of the scan AF executed in step S5 of FIG. 2 will be described.

Figure 7:
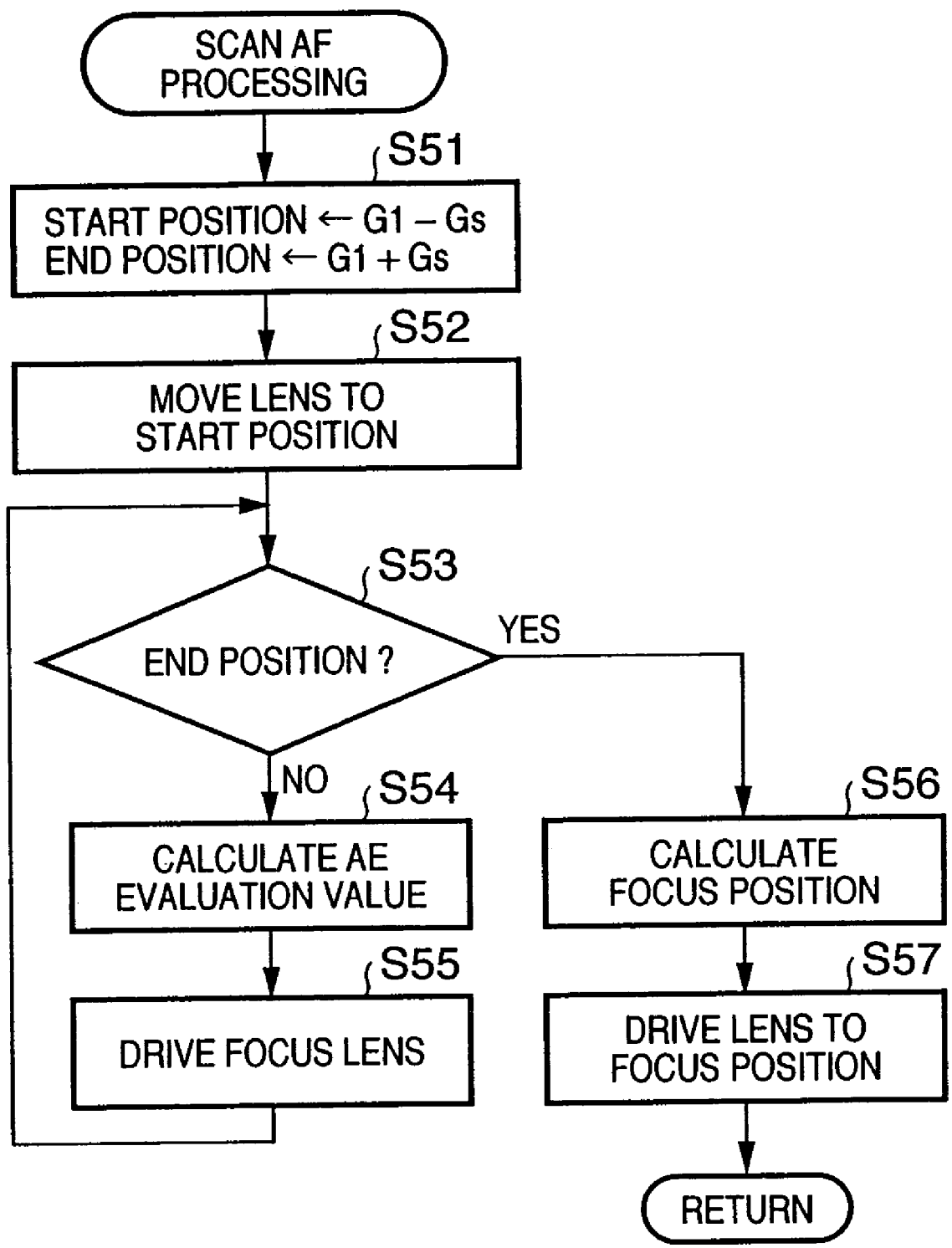
FIG. 7 is a flowchart explaining processing of scan AF according to the embodiment of the present invention.
Figure 8:
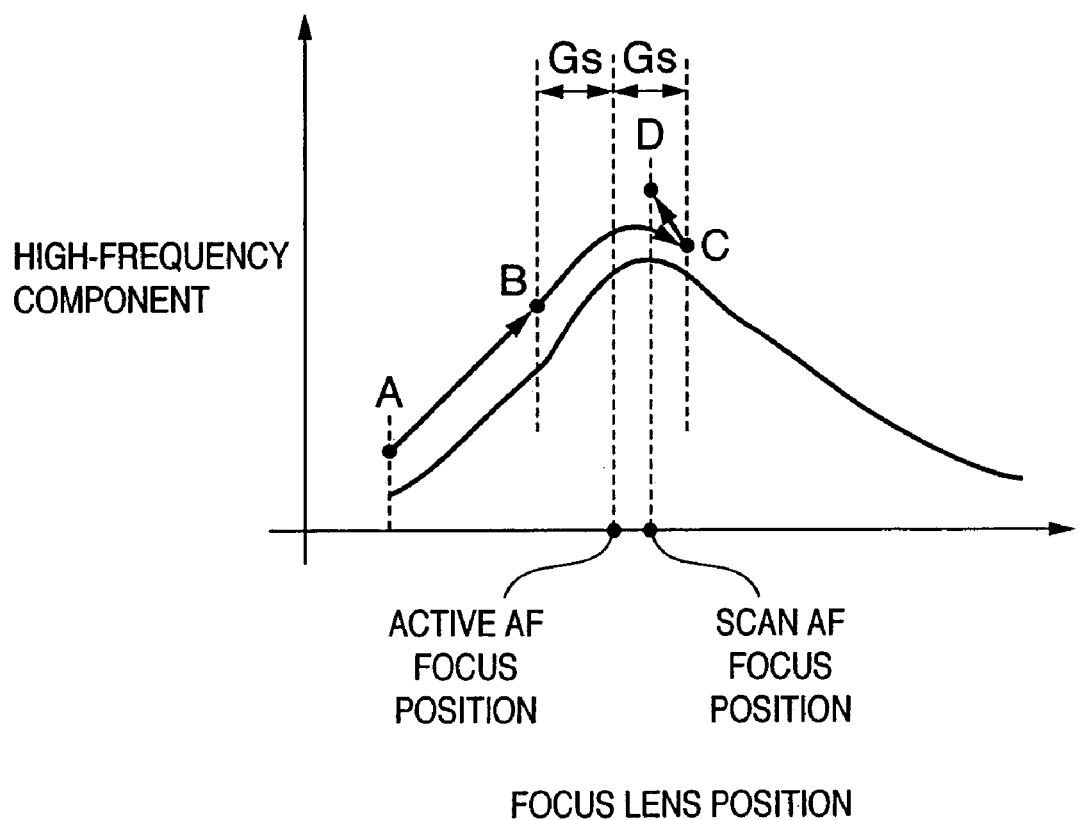
FIG. 8 is a diagram showing a relation between an amount of high-frequency component and a focus lens position at the time when the scan AF is executed according to the embodiment of the present invention.

FIG. 7 is a flowchart showing processing of the scan AF. FIG. 8 shows a relation between an amount of high-frequency component and a focus lens position at the time when the scan AF is executed.

In step S51 of FIG. 7, using the result of the arithmetic operation of the active AF processing, the CPU 15 sets a start position and a stop position for driving the group of focus lenses 3 in order to perform a detection operation of a focus position by the scan AF processing. A value of the start position set here is found by subtracting a variable Gs from the focus position obtained by the active AF (a value indicating the position of the group of focus lenses 3 corresponding to the distance to the object as the result of the arithmetic operation of the active AF processing) G1. In addition, a value of the stop position is found by adding the variable Gs to the focus position G1 obtained by the active AF. In other words, a range in which the scan AF is executed is a predetermined range around the position corresponding to the distance to the object according to the result of the arithmetic operation of the active AF processing. Note that the start position may be found by adding the variable Gs to G1 and the stop position may be found by subtracting the variable Gs from G1. In which case, a driving direction of the group of focus lenses 3 is opposite to that in the case in which the values set in step S51 are adopted.

In addition, this variable Gs is determined taking into account a focal length of the image sensing lens, the result of the arithmetic operation of the active AF processing (distance to the object), parallax, a distance measurement error anticipated in the active AF processing, and the like.

In general, a focusing operation in an image sensing apparatus is an operation for focusing light beams from a desired object, which are converged by an image sensing optical system, on an image sensing surface (light-receiving surface) of an image sensing device (CCD, etc.). Therefore, the group of focus lenses 3, which are a part of the image sensing optical system, are moved in an optical axis direction to obtain the focused state. An amount of the movement in the optical axis direction tends to increase as the object is closer to the image sensing apparatus. In addition, the amount of the movement tends to increase as a focal length of the image sensing lens is longer.

Further, the parallax also tends to increase as the object is closer to the image sensing apparatus and the focal length of the image sensing lens is longer.

Therefore, the variable Gs determining a range of the scan AF has a larger value as the distance to the object obtained from the result of the arithmetic operation of the active AF processing is closer and the focal length of the image sensing lens is longer.

The distance measurement error includes, inter alia, an adjustment error at the time of manufacturing the image sensing apparatus, a temperature error such as distortion caused by an environmental temperature change of the lens-barrel 31, a distance measurement error due to a mechanical error of constituent members (the CCD 5, the light-emitting section 30, etc.) for performing the active AF, a movement error of the group of focus lenses 3, and the like are possible.

Therefore, the variable Gs is set to a value found from the distance to the object obtained from the result of the arithmetic operation of the active AF processing and the focal length of the image sensing lens taking into account the distance measurement error.

For example, the variable Gs can be found by the following expression. Here, K1 is a constant, L is the distance to the object, f is the focal length of the image sensing lens, and $\delta L$ is a coefficient for a distance measurement error or the like.

$$Gs = K1 \times f/L + \delta L$$

Subsequently, in step S52, the CPU 15 drives the focus motor 22 via the second motor drive circuit 19 and moves the group of focus lenses 3 to the start position set in step S51. Then, the CPU 15 executes the scan AF processing for finding a focus position while moving the group of focus lenses 3 with the start point as the origin at a predetermined amount of movement.

In step S53, the CPU 15 judges whether or not the group of focus lenses 3 have reached the end position set in step S51. If the group of focus lenses 3 have not reached the end position, the CPU 15 controls the CCD 5 and the like to acquire image data corresponding to a position of the group of focus lenses 3 at that point. This image data is outputted to the scan AF processing circuit 14 via the image sensing circuit 6 and the A/D conversion circuit 7, and an AF evaluation value is calculated in step S54. This AF evaluation value is outputted to the CPU 15 and stored in the memory for arithmetic operation incorporated in the CPU 15. In the next step S55, the CPU 15 moves the group of focus lenses 3 by a predetermined amount. Thereafter, the CPU 15 returns to step S53 and repeats the same processing until the group of focus lenses 3 reaches the set end position.

Then, when it is judged in step S53 that the group of focus lenses 3 has reached the end position, the process proceeds to step S56. In step S56, the CPU 15 performs an arithmetic operation of a focus position on the basis of the AF evaluation value calculated in step S54. Then, on the basis of a result of the arithmetic operation, in step S57, the CPU 15 drives the focus motor 22 via the second motor drive circuit 19 to move the group of focus lenses 3 to the focus position. When the group of focus lenses 3 stops in this position, the CPU 15 ends the series of sequences. Thereafter, the CPU 15 proceeds to step S6 of FIG. 2.

The series of operations in the san AF processing will be hereinafter described with reference to FIG. 8.

For example, in a state in which the group of focus lenses 3 are in a position indicated by A in FIG. 8, the group of focus lenses 3 first move from the position of A to a position B found by subtracting Gs from a result of distance measurement of the active AF that is the start position (step S52). With this start position as the origin, the scan AF processing is executed until the group of focus lenses 3 reaches a position C found by adding Gs to the result of distance measurement of the active AF that is the end position (steps S53 to S55). Then, on the basis of an AF evaluation acquired by this, the CPU 15 performs an arithmetic operation for obtaining a focus position (step S56). According to this arithmetic operation, a position of D in FIG. 8, which is a position of the group of focus lenses 3 corresponding to a peak value of a high-frequency component, is found as the focus position. Thereafter, the CPU 15 drives the group of focus lenses 3 to that position (step S57).

In this way, the CCD 5 is used as a light-receiving unit in the active AF, a distance to the object is roughly calculated from outputs of a plurality of pixel columns thereof, and a position of the group of focus lenses 3, where a high-frequency component to be outputted is the largest, is found from image signals generated by the CCD 5 while moving the group of focus lenses 3 in a range set around a position corresponding to the roughly calculated distance, whereby the scan AF processing for detecting an accurate focus position is performed. Consequently, it is made possible to detect a focus position at high speed and accurately with a low-cost structure simply added with the light-emitting section for floodlighting an infrared ray.

Second Embodiment

Next, a second embodiment of the present invention will be described.

A basic constitution of an image sensing apparatus and its basic operation procedure according to the second embodiment are the same as the first embodiment. However, a method of detecting an object in the active AF is different from the method that is described with reference to FIGS. 4 and 5 in the first embodiment. Thus, the method will be described.

In the active AF in the second embodiment, detection of an object is performed in a plurality of rows, and a most appropriate object is selected out of obtained objects. In addition, as in the first embodiment, only pixels corresponding to red of a color filter having highest sensitivity to an infrared ray are used.

Figure 9:
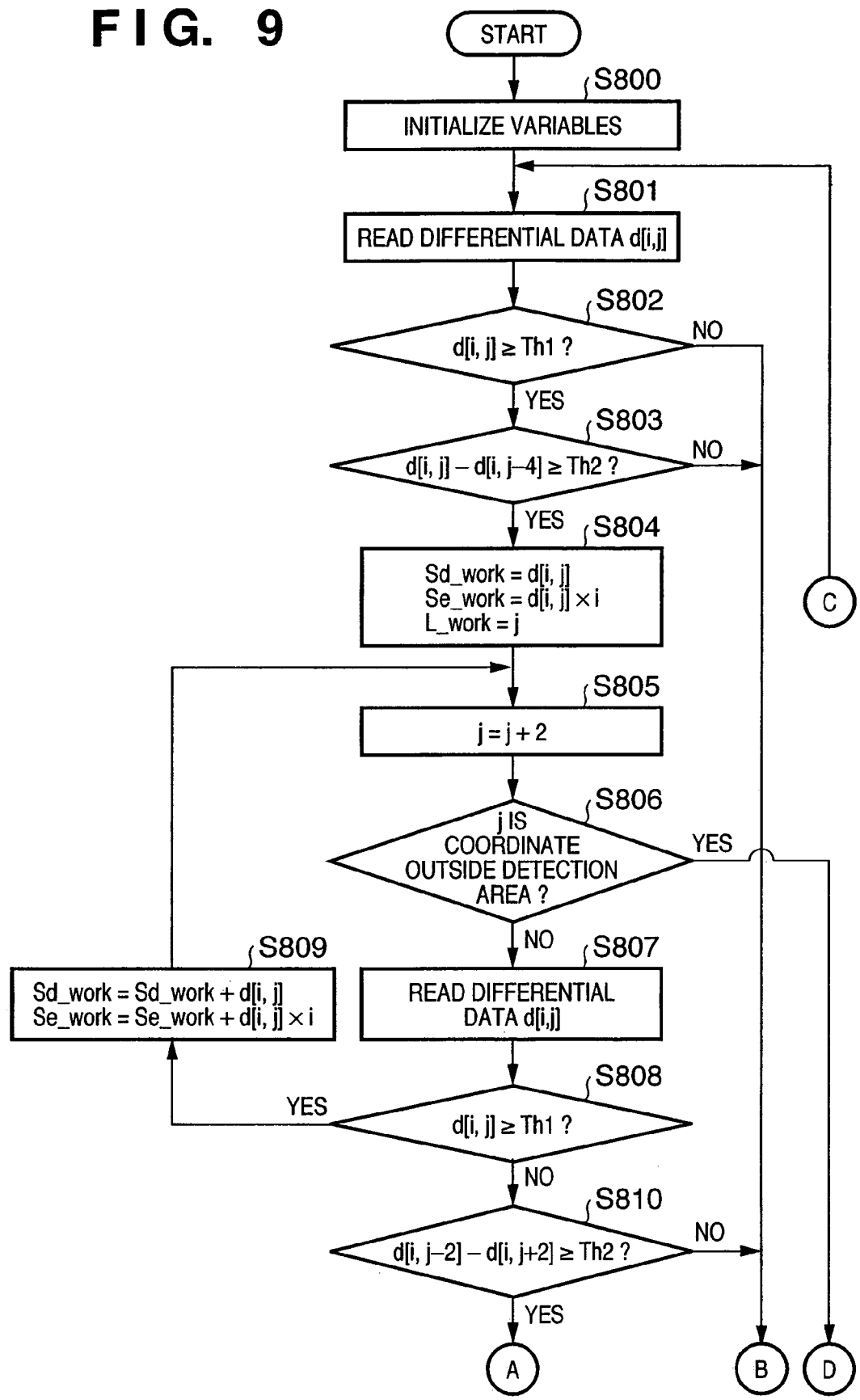
FIG. 9 is a flowchart explaining object detection processing in active AF according to a second embodiment of the present invention.
Figure 10:
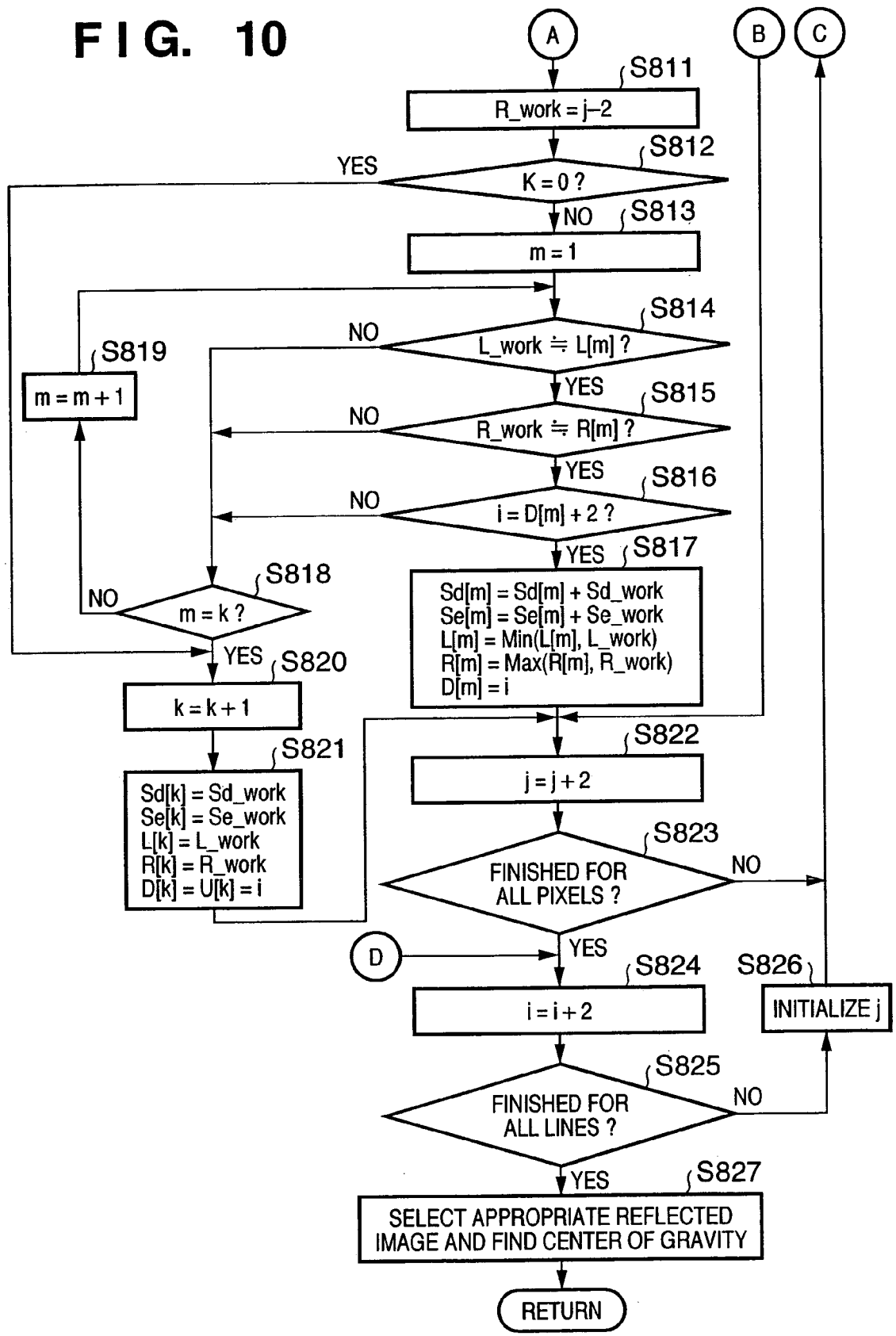
FIG. 10 is a flowchart explaining object detection processing in the active AF according to the second embodiment of the present invention.

Processing for extracting a reflected image and calculating a center of gravity thereof, which is performed in step S28 of FIG. 3, will be hereinafter described with reference to FIGS. 9 and 10. Here, an object with a relatively high luminance having steep leading and trailing edge is extracted, and a center of gravity of the extracted object is found.

First, in step S800, the CPU 15 performs initialization of variables used in an arithmetic operation and initialization of a work area of a memory. Here, the CPU 15 clears a work area in which counters i, j, and k and data of an object are to be stored. In addition, since a plurality of objects may be detected a plurality of memory areas for an arithmetic operation are prepared in which data of the objects is stored.

Next, in step S801, the CPU 15 reads out the differential data stored in the memory incorporated in the CPU 15 in order. Here, each data is represented as d[i,j]. Then, in step S802, the CPU 15 compares d[i,j] with the first threshold value Th1. If d[i,j] is equal to or more than the first threshold value Th1, in step S803, the CPU 15 calculates a difference between d[i,j] and differential data of a pixel that is away from the pixel of d[i,j] by a plurality of pixels (e.g., four pixels), and checks if the difference is equal to or more than a second threshold value Th2. If the difference is equal to or more than the second threshold value Th2, since it can be judged as a leading edge of an object (i.e., a left end of the object), the process proceeds to step S804 and stores various data of this object in the memory incorporated in the CPU 15. Consequently, an object with a relatively high luminance having steep leading edge has been detected. On the other hand, if the condition is not satisfied in step S802 or S803, the process proceeds to step S822 in FIG. 10.

In step S804, the CPU 15 finds a sum of luminance d[i,j] of signals and a sum of products of luminance of signals and coordinates, d[i,j]×i and d[i,j]×j, as data of the object and stores the sums. In addition, the CPU 15 stores j as L_work as a coordinate of the left end of the object. Now, when it is assumed that a sum of luminance of the object is Sd_work and a sum of products of luminance and coordinates is Se_work, the following equations are used.

$Sd\_work=d[i,j]$ $Se\_work=d[i,j]\times i$

In step S805, the CPU 15 increments the counter j by two to set a differential data value of the next pixel corresponding red of a color separation filter as a subject of processing. In the next step S806, the CPU 15 judges if the value of the counter j indicates a coordinate of a pixel outside the detection area. If the value indicates a coordinate of a pixel outside the detection area, the process proceeds to step S824, and if the value indicates a coordinate of a pixel within the detection area, the process proceeds to step S807. In step S806, the CPU 15 reads out the differential data d[i,j] stored in the incorporated memory. Then, in step S808, the CPU 15 compares d[i,j] with the first threshold value Th1. If d[i,j] is equal to or more than the first threshold value Th1, since the object still continues, the process proceeds to step S809 and updates the data of the object in accordance with the following equations.

$Sd\_work=Sd\_work+d[i,j]$ $Se\_work=Se\_work+d[i,j]\times i$

The CPU 15 performs these processes for updating data of the object until the condition of step S808 are not satisfied while updating the counter j in step S805. However, if the detection for all the pixels is finished while thes processes are continued (YES in step S806), since the condition of trailing edge is not satisfied, the CPU 15 judges that the object currently detected is inappropriate, does not perform the processing for storing data of the object stored in the work area to that point in the storage area, and the pocess immediately proceeds to step S824.

If the condition of step S808 is not satisfied (if data is not equal to or more than the first threshold value Th1), since it can be judged that the object has ended, the CPU 15 checks whether or not the object has a steep trailing edge. In step S810, the CPU 15 calculates a difference between d[i,j] and differential data of a pixel that is away from the pixel of d[i,j] by a plurality of pixels (e.g., four pixels), finds inclination at the trailing edge of the object, and checks if the inclination is equal to or more than the second threshold value Th2. If the declination at the trailing edge of the object is equal to or more than the second threshold value Th2, since an object with a relatively high luminance having steep leading and trailing edges has been extracted, the CPU 15 stores j-2 as R_work as a coordinate of the right end of the object in step S811.

Then, the CPU 15 proceeds to step S812 and performs processing for storing the data of the object stored in the work area.

On the other hand, if the condition is not satisfied in step S810, since an object with a relatively high luminance having steep leading and trailing edges has not been extracted, the CPU 15 does not store the data of the object stored in the work area to that point in the storage area and the process proceeds to step S822.

In step S812 and subsequent steps, the CPU 15 performs processing for storing the data of the object stored in the work area.

In this processing, first, the CPU 15 checks whether or not an object, which is the same as the object stored in the work area, already exists.

In step S812, the CPU 15 checks a value of the counter k indicating the number of areas in which the data of the object has been stored to that point. If k is equal to zero, since the data of the object has not been stored to that point, the CPU 15 proceeds to processing of step S819 and subsequent steps for generating an area for a new object and storing the data. This processing will be described later.

If k is not equal to zero, the CPU 15 initializes a value of the counter m to one in step S813 and sequentially checks the areas from the area in which the first object is stored. In step S814, the CPU 15 compares a value L[m] of the left end of object data stored in an m-th storage area and a value L_work of the left end of object data stored in the work area. If these values are substantially the same, the process proceeds to step S815. Subsequently, in step S815, the CPU 15 compares a value R[m] of the right end of the object data stored in the m-th storage area and a value R_work of the right end of the object data stored in the work area. If the values are substantially the same, the process proceeds to step S816. In step S816, the CPU 15 checks if a value D[m] at the lower end of the object data stored in the m-th storage area and the object of the work area are adjacent to each other in the vertical direction. If the vertical direction coordinate i at the time when the data of the work area is detected is D[m]+2, the value D[m] and the object are adjacent to each other. In this case, since it can be judged that both of them are the same object, the process proceeds to step S817 and the CPU 15 performs processing for storing the object data of the work area in the m-th storage area.

In step S817, the CPU 15 stores the data of the work area in the m-th storage area as indicated below.

$Sd[m]=Sd[m]+Sd\_work$ $Se[m]=Se[m]+Se\_work$ $L[m]=Min(L[m], L\_work)$ $R[m]=Max(R[m], R\_work)$ $D[m]=i$ Here, Sd[m] indicates a sum of luminance of signals, Se[m] indicates a sum of products of luminance of signals and horizontal direction coordinates, L[m] indicates the coordinate of the left end of the object, R[m] indicates the coordinate o the right end of the object, and D[m] indicates the coordinate o the lower end of the object. In addition, Min(L[m],L_work) is an arithmetic operation for selecting a smaller one of L[m] and L_work, and Max(R[m], R_work) is an arithmetic operation for selecting a larger one of R[m] and R_work. Consequently, outer coordinates can be stored as coordinates at the left and right ends. In addition, a suffix m in the brackets represents a parameter in the m-th storage area.

If the condition is not satisfied in steps S814, S815, or S816, in step S818, the CPU 15 compares the counter m and the number of storage areas k to thereby check if the comparison with all the existing storage areas has been finished. If m is equal to k, since the comparison with all the storage areas has been finished, there is no object that is the same as the object stored in the work area. Thus, the CPU 15 proceeds to step S820 in order to generate a new storage area and store the object data of the work area in the new storage area.

If the comparison with all the storage areas has not been finished (if m<k), the CPU 15 increments the counter m by one in step S819, and then returns to step S814 and performs comparison with data of the next storage area.

In step S820, the CPU 15 increments a value of the counter k, which indicates the number of areas storing data of the objects, by one to increase the number of storage areas, and then proceeds to step S821, generates an area for storing data of a new object and stores the data. Storing in step S821 is performed as indicated below.

$Sd[k]=Sd\_work$ $Se[k]=Se\_work$ $L[k]=L\_work$ $R[k]=R\_work$ $U[k]=i$ $D[k]=i$ Here, Sd[k] indicates a sum of luminance of signals, Se[k] indicates a sum of products of luminance of signals and horizontal direction coordinates, L[k] indicates the coordinate of the left end of the object, R[k] indicates the coordinate of the right end of the object, U[k] indicates the coordinate of the upper end of the object, and D[k] indicates the coordinate of the lower end of the object. In addition, a suffix k in the brackets represents a parameter in the k-th storage area.

Then, the process proceeds to step S822 and increments the counter j by two to set the next pixel corresponding to red of the color separation filter as a subject of an arithmetic operation, and then, in step S823, the CPU 15 checks whether or not processing for all the pixels in the horizontal direction has been finished. If the processing for all the pixels in the horizontal direction has not been finished, the CPU 15 returns to step S801 and continues the processing.

If the detection for all the pixels in the horizontal direction has been finished, in step S824, the CPU 15 increments the counter i by two to set the next row, on which a pixel corresponding to red of the color separation filter exists, as a subject of processing, and then, in step S825, checks whether or not processing for all the rows has been finished. If the processing for all the rows in the vertical direction has not been finished, the CPU 15 initializes j in step S826, and then returns to step S801 and continues the processing.

If the detection for all the rows has been finished, in step S827, the CPU 15 finds a center of gravity of the detected object. The coordinate Px of a center of gravity in the horizontal direction of the object is as indicated below.

$Px=Se[m]/Sd[m]$

In addition, since a center of gravity in the vertical direction is meaningless in the case of finding a distance to the object in the active AF processing, an arithmetic operation for finding the center of gravity in the vertical direction is not performed.

Further, when a plurality of objects have been detected, an object/objects for which both of R[m]−L[m] and D[m]−U[m] are within a predetermined range is/are selected. This is because, since a size of a reflected image of a light-emitting section 30 on the surface of the CCD 5 should be substantially fixed, only reflected image/images falling within a fixed range anticipating an error is/are considered to be correct reflected image/images of the light-emitting section 30. In the case in which a plurality of objects still remain, first, a difference between (R[m]−L[m]) and (D[m]−U[m]) is checked, and an object with the smallest difference is selected. This is because, in the case in which a shape of a light-emitting section 30 is directly reflected and focused on the CCD 5, it is considered that sizes in the horizontal direction and the vertical direction thereof are substantially the same. However, since an error due to a form of an object to be sensed, a reflectivity, or the like occurs, object/objects having the difference/differences within a predetermined range about the lowest difference is/are considered to have the substantially same lowest difference between (R[m]−L[m]) and (D[m]−U[m]). Then, an object with a largest value of Sd[m]/(R[m]−L[m]) is selected out of the objects. An object with a largest value of Sd[m]/(R[m]−L[m]) is selected because, since external light elimination has been performed for the object, it is considered that a luminance of a reflected image of a light-emitting section 30 becomes the maximum.

Third Embodiment

Next, a third embodiment of the present invention will be described.

A basis constitution of an image sensing apparatus and its basic operation procedure according to the third embodiment are the same as the first embodiment. However, a method of detecting an object in the active AF is different from the method that is described with reference to FIG. 4 in the first embodiment. Thus, the method will be described.

In the active AF in the third embodiment, detection of an object is performed using differential data of one line, and a most appropriate object is selected out of obtained objects.

Processing for extracting a reflected image and calculating a center of gravity thereof, which is performed in step S28 of FIG. 3, will be hereinafter described with reference to FIGS. 11 and 5. Here, an object with a relatively high luminance having steep leading and trailing edges is extracted, and a center of gravity of the extracted object is found.

First, in step S500, the CPU 15 performs initialization of variables used in an arithmetic operation and initialization of a work area of a memory. Here, the CPU 15 clears a work area in which counters i and k and data of an object are to be stored. In addition, since a plurality of objects, which are considered to be a reflected image, may be detected, a plurality of memory areas for an arithmetic operation are prepared in which data of the objects is stored.

Next, in step S501, the CPU 15 reads out differential data of a predetermined row stored in the memory incorporated in the CPU 15. A value of this data is represented as d[i]. Then, in step S502, the CPU 15 compares d[i] with the first threshold value Th1. If d[i] is equal to or more than the first threshold value Th1, in step S503, the CPU 15 calculates a difference between d[i] and differential data of a pixel that is away from the pixel of d[i] by a plurality of pixels (e.g., two pixels), and checks if the difference is equal to or more than a second threshold value Th2. If the difference is equal to or more than the second threshold value Th2, since it can be judged as a leading edge of an object (i.e., a left end of the object), the process proceeds to step S504 and various data of this object is stored in the memory incorporated in the CPU 15. Consequently, an object with a relatively high luminance having steep leading edge has been detected. If the condition is not satisfied in step S502 or S503, the process proceeds to step S416 in FIG. 5.

In step S504, the CPU 15 finds a sum of luminance d[i] of signals and a sum of products of luminance of signals and coordinates, d[i]×i, as data of the object and stores the sums. In addition, the CPU 15 stores i as L[k] as the coordinate of the left end of the object. Now, when it is assumed that a sum of luminance of a k-th object is Sd[k] and a sum of products of luminance and coordinates is Se[k], the following equations are used.

$$Sd[k]=d[i]+d[i-1]$$

$$Se[k]=d[i]\times i+d[i-1]\times(i-1)$$

In step S505, the CPU 15 increments the counter i by one to set the next pixel as a subject of processing. Then, in step S506, the CPU 15 judges if the processing has been finished for all the pixels of the differential data of the current row. If the processing has been finished, the process proceeds to step S510, and if the processing has not been finished, the process proceeds to step S507. In step S507, the CPU 15 reads out the next differential data d[i] stored in the incorporated memory. Then, in step S508, the CPU 15 compares the d[i] with the first threshold value Th1. If d[i] is equal to or more than the first threshold value Th1, since the object still continues, the process proceeds to step S509 and updates the data of the object in accordance with the following equations.

$$Sd[k]=Sd[k]+d[i]$$

$$Se[k]=Se[k]+d[i]\times i$$

The CPU 15 performs these processes for updating data of the object until the condition of step S508 are not satisfied while updating the counter i in step S505. However, if the detection for all the pixels is finished while these processes are performed (YES in step S506), since the condition of trailing is not satisfied, the CPU 15 judges that the object currently detected is inappropriate, clears the data of the object in step S510, and the process immediately proceeds to step S418 of FIG. 5.

If the condition of step S508 is not satisfied (if d[i] is not equal to or more than the first threshold value Th1), since it can be judged that the object has ended, the CPU 15 checks whether or not the object has a steep trailing edge. As shown in FIG. 5, in step S412, the CPU 15 calculates a difference between d[i] and differential data of a pixel that is away from the pixel of d[i] by a plurality of pixels (e.g., two pixels), finds inclination at the trailing edge of the object, and checks if the declination is equal to or more than the second threshold value Th2. If the declination at the trailing edge of the object is equal to or more than the second threshold value Th2, since an object with a relatively high luminance having steep leading and trailing edges has been extracted, the process proceeds to step S413 and the CPU 15 updates the data of the object in accordance with the following equations.

$$Sd[k]=Sd[k]+d[i]$$

$$Se[k]=Se[k]+d[i]\times i$$

Moreover, the CPU 15 stores i in R[k] as the coordinate on the right end of the object. Then, the CPU 15 increments the counter k by one (step S414) and updates an address of the memory storing the data of the object. On the other hand, if the condition is not satisfied in step S412, since an object with a relatively high luminance having steep leading and trailing edges has not been extracted, the CPU 15 clears the data of the object that has been stored to that point (step S415).

Then, the process proceeds to step S416 and the CPU 15 increments the counter i by one to set the next pixel as a subject of an arithmetic operation, and then, in step S417, checks whether or not detection for all the pixels in the row has been finished.

If the detection for all the pixels in the row has been finished, in step S418, the CPU 15 finds a center of gravity of the detected object. The coordinate Px of the center of gravity of the object is calculated as follows.

$$Px=Se[k]/Sd[k]$$

It should be noted that, when a plurality of objects have been detected, the CPU 15 selects object/objects for which R[k]−L[k] is within a predetermined range. This is because, since a size of a reflected image of a light-emitting section 30 on the CCD 5 should be substantially fixed, only reflected image/images falling within a fixed range anticipating an error is/are considered to be correct reflected image/images of the light-emitting section 30. In the case in which a plurality of objects still remain, an object for which a value of Sd[k]/(R[k]−L[k]) is the largest is selected. This is because, since the external light elimination has been performed for the object, it is considered that a luminance of a reflected image of a light-emitting section 30 becomes the maximum.

Sensitivity to an infrared ray of each color of the color separation filter arranged in front of the CCD 5 in detecting an object has been neglected. However, since there is a difference of sensitivity in practice, the processing for detection of an object is performed after correcting respective pixel data in accordance with the sensitivity to an infrared light of each color of the filter, or as described in the first embodiment, only pixel data corresponding to red of a color filter having the highest sensitivity to an infrared ray are used.

In this way, the CPU 15 ends the processing for finding a center of gravity of a reflected image in the third embodiment and returns to step S28 of FIG. 3.

In addition, in the third embodiment, in performing the partial read-out processing in step S22 and storing the read-out partial image data in step S23 in the active AF processing shown in FIG. 3, an output of the A/D conversion circuit 7 is controlled to be inputted to the CPU 15. Thus, the output of the A/D conversion circuit 7 is not temporarily stored in the VRAM 8. Thus, an image due to charge accumulation with the light-emitting section 30 on is not displayed on the LCD 10 and an image temporarily stored immediately before that is displayed.

An image due to charge accumulation with the light-emitting section 30 on is not displayed in order to prevent an image causing a sense of incongruity from being displayed on the LCD 10 due to the fact that only a part of images are read out for speed-up of an arithmetic operation and a reflected image of a light-emitting device is imprinted. In addition, since an image due to charge accumulation with the light-emitting section 30 off performed in step S24 of FIG. 3 immediately after the charge accumulation with the light-emitting section 30 on performed in step S21 of FIG. 3 is displayed, a sense of incongruity such as a freezing screen is not given to a user.

Figure 11:
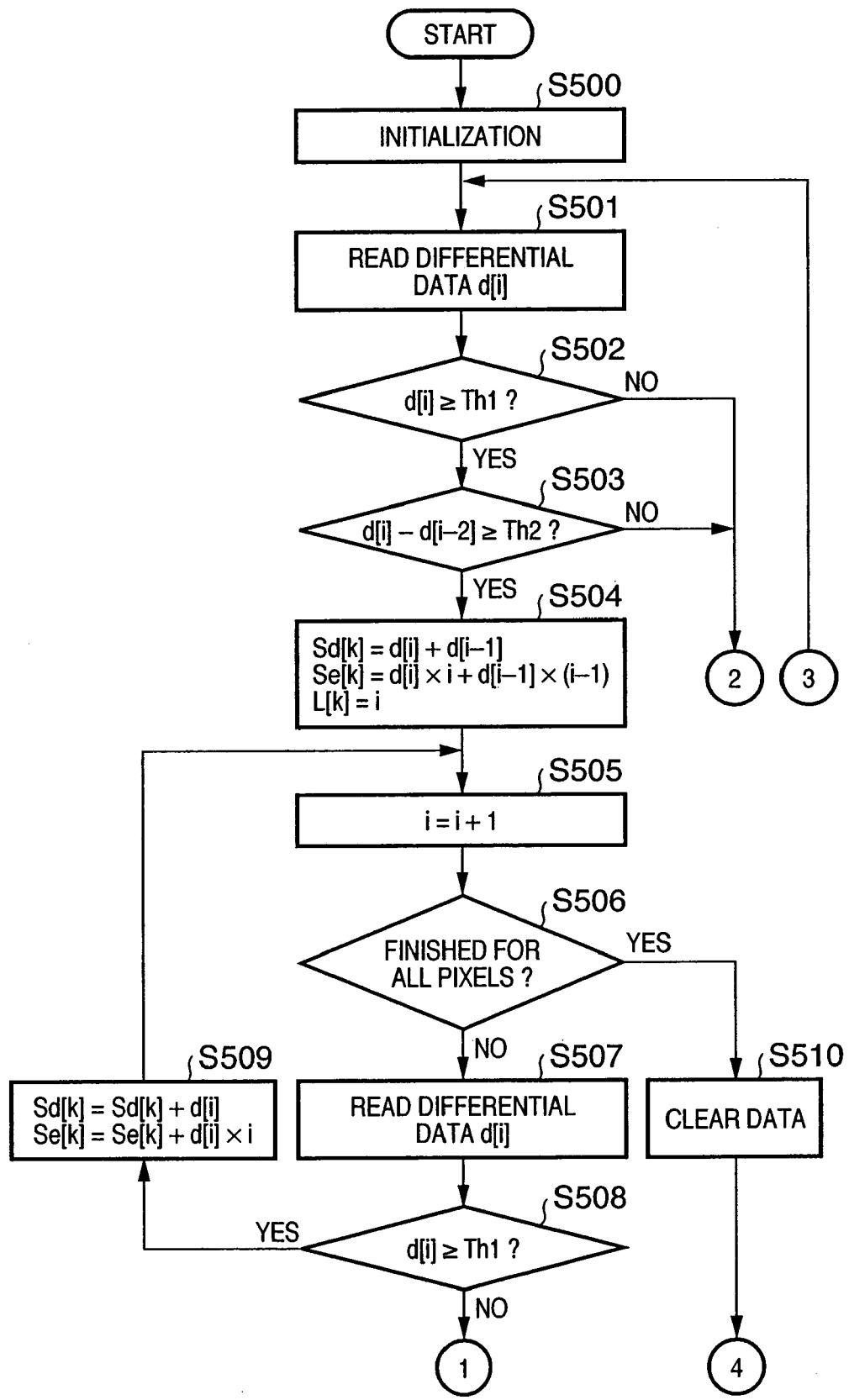
FIG. 11 is a flowchart explaining object detection processing in active AF according to a third embodiment of the present invention.

Note that, in the third embodiment, since only differential data for one line is used, it is advisable to control the partial reading performed in step S22 of the active AF processing shown in FIG. 3 so as to read out only a predetermined row used in the processing of FIG. 11 rather than reading out an area (detection area) in a central part as in the first embodiment.

Fourth Embodiment

Next, a fourth embodiment of the present invention will be described.

A basis constitution of an image sensing apparatus and its basic operation procedure according to the fourth embodiment are the same as the first embodiment. However, the fourth embodiment has a characteristic in image display control at the time of the active AF processing.

In the fourth embodiment, unlike the third embodiment, image signals are stored in the VRAM 8 even at the time when a light beam is irradiated in the active AF. In that case, a flag indicating that the light beam is irradiated is set such that the image signals stored in the VRAM 8 are not outputted to the D/A conversion circuit 9 in a state in which this flag is set. With such control, an image sensed at the time when a light beam is irradiated is not displayed on an image display apparatus.

Figure 12:
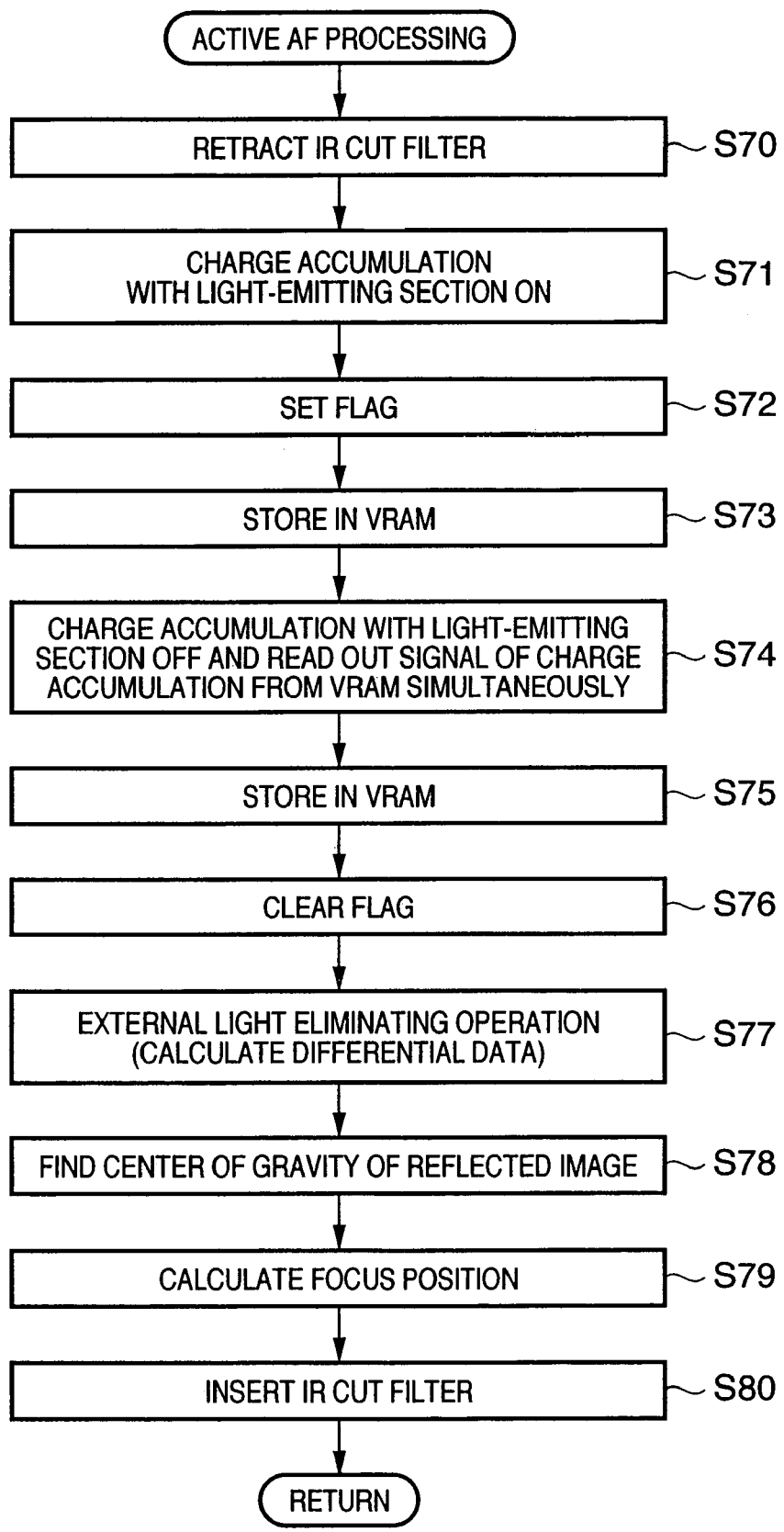
FIG. 12 is a flowchart showing a flow of an operation of active AF according to a fourth embodiment of the present invention.

Details of the display control will be hereinafter described with reference to FIG. 12.

First, in step S70, the CPU 15 drives the filter drive circuit 33 to retract the iR cut filter 32 from the front of the CCD 5 so as not to attenuate an infrared ray component that is attenuated at the time of image sensing. This is because an infrared light-emitting device is used as a light-emitting section 30 for the active AF processing since reflectance of an infrared ray on various objects is more stable than a normal ray and good distance measurement can be expected.

Subsequently, in step S71, the CPU 15 performs charge accumulation with the light-emitting section 30 on. The CPU 15 causes the light-emitting section 30 to emit light to irradiate an infrared ray to the object. At the same time, the CPU 15 adjusts an amount of light to be received by the CCD 5 with the stop 4. More specifically, the CPU 15 performs control such that the stop 4 is narrowed and an amount of light emission of the light-emitting section 30 is increased when it is bright and the stop 4 is opened and the amount of light emission of the light-emitting section 30 is reduced when it is dark. Thereafter, in step S72, the CPU 15 sets a flag for prohibiting output of image signals from the VRAM 8 to the D/A conversion circuit 9.

Next, in step S73, a signal obtained by the charge accumulation with the light-emitting section 30 on is stored in the VRAM 8 by hardware means according to an instruction from the CPU 15. More specifically, a received image of the object is converted into electric signals by the photoelectric conversion processing of the CCD 5 and outputted to the image sensing circuit 6. In the image sensing circuit 6, various kinds of signal processing are applied to the inputted signal to generate image signals. These image signals are outputted to the A/D conversion circuit 7 and converted into digital signals (image data), and are then temporarily stored in the VRAM 8. However, the image data temporarily stored in the VRAM 8 is not outputted to the D/A conversion circuit 9. In this case, since the LCD 10 is driven in accordance with data which was set immediately before this image data is stored, the image due to the charge accumulation with the light-emitting section 30 on is not displayed on the LCD 10, and an image acquired immediately before that continues to be displayed.

Next, the process proceeds to step S74 and the CPU 15 performs charge accumulation with the light-emitting section 30 off with the same stop as at the time of the charge accumulation with the light-emitting section 30 on in step S71. Simultaneously with this accumulation which is, before outputting signals from the CCD 5 to the image sensing circuit 6, the CPU 15 reads out only a part of the image data, which corresponds to a central part of the output signal from the CCD 5, from the VRAM 8 and stores it in the incorporated memory. This is because, since the CPU 15 only has to store a part, on which a reflected image from a subject is formed, an amount of data is small. In addition, speed-up of processing can be expected by performing transfer of data during the charge accumulation with the light-emitting section 30 off. However, in the case in which the charge accumulation with the light-emitting section 30 off ends before the transfer from the VRAM 8 to the memory incorporated in the CPU 15 because the object to be sensed is extremely bright, the charge accumulation with the light-emitting section 30 off is performed after the transfer from the VRAM 8 to the memory incorporated in the CPU 15 ends.

Next, in step S75, the signal obtained in the charge accumulation with the light-emitting section 30 off is stored in the VRAM 8 by the hardware means according to an instruction from the CPU 15. After an amount of light from the object to be sensed is adjusted by the stop 4, the image formed on the light-receiving surface of the CCD 5 is converted into electric signals by the photoelectric conversion processing by the CCD 5 to be outputted to the image sensing circuit 6. In the image sensing circuit 6, various kinds of signal processing are applied to the inputted signals, and image signals of a predetermined form are generated. These image signals are outputted to the A/D conversion circuit 7 and converted into digital signals (image data), and are then temporarily stored in the VRAM 8.

Then, in step S76, the flag prohibiting transfer of image signals from the VRAM 8 to the D/A conversion circuit 9 is cleared. The image signals read out from the VRAM 8 are converted into analog signals by the D/A conversion circuit 9 and converted into image signals of a form suitable for display, and are then displayed as an image on the LCD 10.

The process proceeds to step S77 and the CPU 15 performs an external light eliminating operation. Here, the CPU 15 finds a difference between image data of the charge accumulation with the light-emitting section 30 on and image data of the charge accumulation with the light-emitting section 30 off to thereby find data (object) of a reflected image obtained as an infrared ray irradiated from the light-emitting section 30 is reflected on the object. Since a component of an image formed by external light can be removed, it becomes easy to find a center of the reflected image practically, the CPU 15 reads data of a part corresponding to the image data stored in the memory incorporated in the CPU 15 among the image data stored in the VRAM 8 and calculates differences between the read data and the image data stored in the memory incorporated in the CPU 15 to thereby perform external light elimination. A result of the arithmetic operation (differential data) with the external light eliminated in this way is stored in the memory incorporated in the CPU 15.

Subsequently, in step S78, the CPU 15 extracts a reflected image and calculates a center of gravity thereof. The CPU 15 extracts an object with a relatively high luminance having steep leading and trailing edges, and finds a center of gravity of the extracted object. Since this processing may be the processing described in any one of the first to third embodiments, the description of the processing will be omitted. Then, in step S79, the CPU 15 finds a distance to the object from a position of the center of gravity of the reflected image in the same manner as the processing performed in step S29 of FIG. 3.

Thereafter, the process proceeds to step S80 and inserts the iR cut filter 32, which was retracted from the front of the CCD 5 in step S70, in front of the CCD 5 again.

Fifth Embodiment

Next, a fifth embodiment of the present invention will be described.

In the fifth embodiment of the present invention, a VRAM 80, which stores image signals obtained at the time when a light beam is irradiated in the active AF, is provided anew, and image signals obtained at the time when a light beam is irradiated by the light-emitting section 30 are stored in the VRAM 80. Since this VRAM 80 is not connected to the D/A conversion circuit 9, an image sensed at the time when a light beam is irradiated is not displayed on an image display apparatus.

Figure 13:
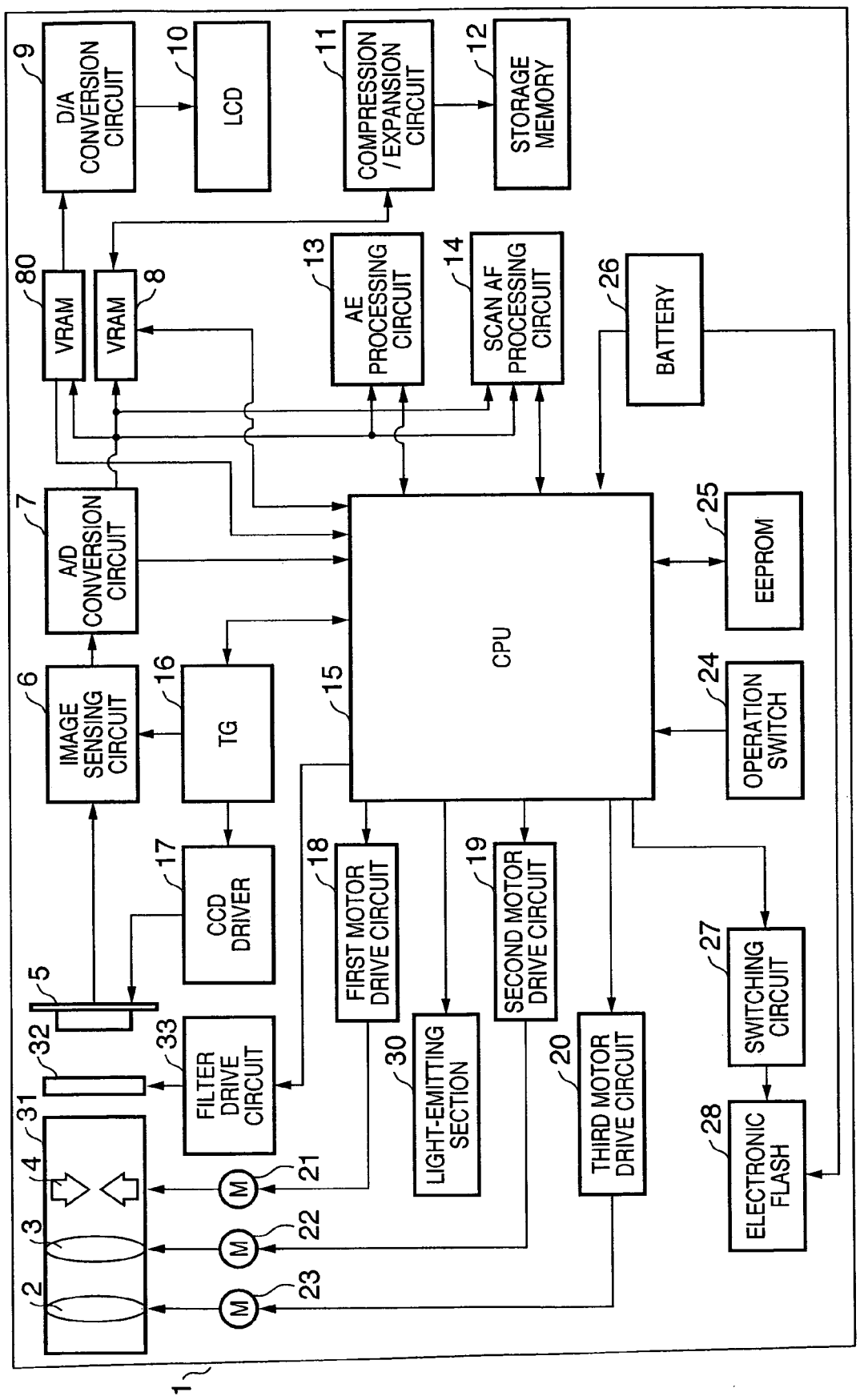
FIG. 13 is a block diagram showing a schematic structure of an image sensing apparatus according to a fifth embodiment of the present invention.
Figure 14:
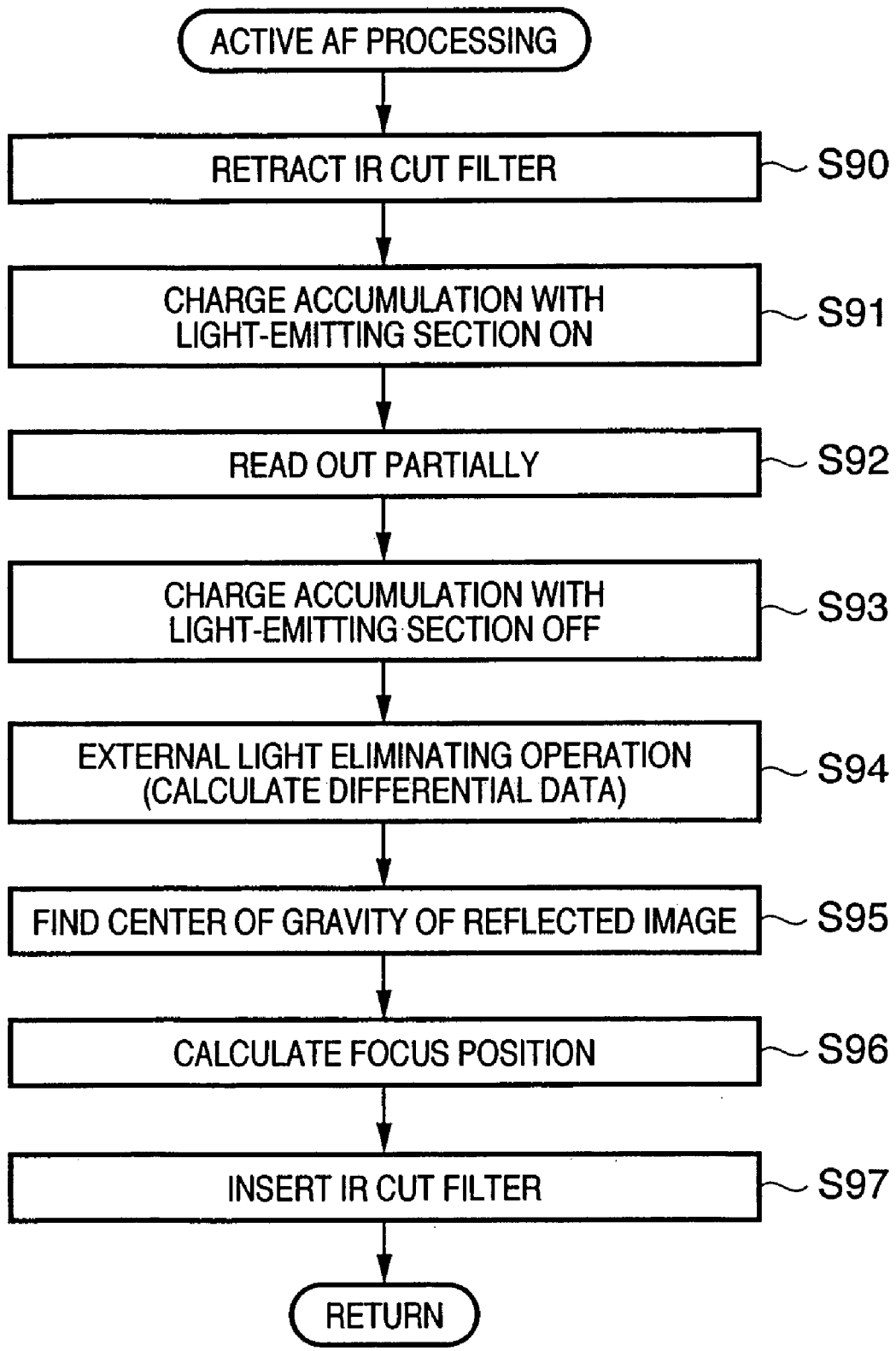
FIG. 14 is a flowchart showing a flow of an operation of active AF according to the fifth embodiment of the present invention.

A basic structure of an image sensing apparatus according to the fifth embodiment is shown in FIG. 13. The fifth embodiment is different from the first to fourth embodiments only in that the VRAM 80, which stores image signals obtained at the time when a light beam is irradiated, is provided anew. IA basic operation procedure is the same as the first embodiment except that processing is performed using the VRAM 80 in the active AF. An operation of the active AF in the fifth embodiment will be hereinafter described with reference to FIG. 14.

First, in step S90, the CPU 15 drives the filter drive circuit 33 to retract the iR cut filter 32 from the front of the CCD 5 so as not to attenuate an infrared ray component that is attenuated at the time of image sensing. This is because an infrared light-emitting device is used as a light-emitting section 30 for the active AF processing since reflectance of an infrared ray on various objects is more stable than a normal ray and good distance measurement can be expected.

Subsequently, in step S91, the CPU 15 performs charge accumulation with the light-emitting section 30 on. The CPU 15 causes the light-emitting section 30 to emit light to irradiate an infrared ray to the object. At the same time, the CPU 15 adjusts an amount of light to be received by the CCD 5 with the stop 4. More specifically, the CPU 15 performs control such that the stop 4 is narrowed and an amount of light emission of the light-emitting section 30 is increased when it is bright and the stop 4 is opened and the amount of light emission of the light-emitting section 30 is reduced when it is dark. The incident optical image of the object is converted into electric signals by the photoelectric conversion processing of the CCD 5 and outputted to the image sensing circuit 6.

Next, in step S92, the CPU 15 controls the image sensing circuit 6 to read out the electric signals only from a detection area corresponding to a central part of the output signal from the CCD 5. In the image sensing circuit 6, various kinds of signal processing are applied to the inputted signals to generate image signals of a predetermined form. These image signals are outputted to the A/D conversion circuit 7 and converted into digital signals (image data), and are then temporarily stored in the VRAM 80. Speed-up of processing can also be realized by reading only a part in this way. Since the VRAM 80 is not connected to the D/A conversion circuit 9, an image obtained at the time of the charge accumulation with the light-emitting section 30 on is not naturally displayed on the LCD 10. An image, which has been displayed immediately before this image data acquisition continues to be displayed on the LCD 10. With such display control, it is possible to prevent an image causing a sense of incongruity from being displayed on the LCD 10 due to the fact that only a part of image signals are read out for speed-up of an arithmetic operation and a reflected image of a light-emitting device is imprinted. In addition, since an image due to charge accumulation with the light-emitting section 30 off performed in step S94 of FIG. 14 immediately after the charge accumulation with the light-emitting section 30 on performed in step S91 is displayed, a sense of incongruity such as a freezing screen is not given to a user.

The process proceeds to step S93 and the CPU 15 performs the charge accumulation with the light-emitting section 30 off with the same stop as at the time of the charge accumulation with the light-emitting section 30 on in step S21. The optical image of the object formed on the light receiving surface of the CCD 5, after an amount of light thereof is adjusted by the stop 4, is converted into electric signals by the photoelectric conversion processing of the CCD 5 and outputted to the image sensing circuit 6. In the image sensing circuit 6, various kinds of signal processing are applied to the inputted signals to generate image signals. These image signals are outputted to the A/D conversion circuit 7 and converted into digital signals (image data), and are then temporarily stored in the VRAM 8. Then, the image signals are outputted to the D/A conversion circuit 9, converted into analog signals and converted into image signals of a form suitable for display, and are then displayed as an image on the LCD 10.

Next, the process proceeds to step S94 and performs an external light eliminating operation. Here, the CPU 15 finds differences between image data of the charge accumulation with the light-emitting section 30 on and image data of the charge accumulation with the light-emitting section 30 off to thereby find data of a reflected image obtained as a light beam irradiated from the light-emitting section 30 is reflected on the subject. Since component of an image formed by external light can be removed, it becomes easy to find a center of the reflected image.

Practically, the CPU 15 calculates differences between the image data stored in the VRAM 80 and the image data stored in the VRAM 8 to thereby perform external light elimination. More specifically, the CPU 15 subtracts the image data, which corresponds to the data stored in the VRAM 80, stored in the VRAM 8 from the image data of the VRAM 80 and sequentially stores values the differences in the memory incorporated in the CPU 15. In this way, transfer in terms of hardware with which transfer of data is performed at high speed is increased, and data transfer in terms of software is reduced, whereby speed-up of an arithmetic operation can be expected.

Subsequently, in step S95, the CPU 15 extracts a reflected image and calculates a center of gravity thereof. The CPU 15 extracts an object with a relatively high luminance having steep leading and trailing edges and finds a center of gravity of the extracted object. Since this processing may be the processing described in any one of the first to third embodiments, the description of the processing will be omitted. Then, in step S96, the CPU 15 finds a distance to the object from a position of the center of gravity of the reflected image in the same manner as the processing performed in step S29 of FIG. 3.

Thereafter, the process proceeds to step S97 and the CPU 15 inserts the iR cut filter 32, which was retracted from the front of the CCD 5 in step S90, in front of the CCD 5 again.

The present invention is not limited to the above embodiments and various changes and modifications can be made within the spirit and scope of the present invention. Therefore to apprise the public of the scope of the present invention, the following claims are made.

What is claimed is:

1. An autofocus control apparatus in an image sensing apparatus that comprises: an optical system including a focus lens; an image sensing unit that photoelectrically converts light incident via said optical system into image signals and outputs the image signals; and a drive unit that drives said focus lens to adjust a focus position, said autofocus control apparatus comprising:
a floodlighting unit; and
a focus position detector that performs focus position detection according to an active system and focus position detection according to a passive system on the basis of the image signals obtained from said image sensing unit,
wherein said focus position detector, at the time of focus position detection according to the active system, acquires first image signals with said image sensing unit performing floodlighting with said floodlighting unit, acquires second image signals with said image sensing unit without performing the floodlighting with said floodlighting unit, and detects a focus position on the basis of differential signals between the first image signals and the second image signals, and
wherein the first image signals are of a predetermined one row or one column of said image sensing unit, and the differential signals are of the one row or one column.

2. An autofocus control apparatus in an image sensing apparatus that comprises: an optical system including a focus lens; an image sensing unit that photoelectrically converts light incident via said optical system into image signals and outputs the image signals; and a drive unit that drives said focus lens to adjust a focus position, said autofocus control apparatus comprising:
a floodlighting unit;
a focus position detector that performs focus position detection according to an active system and focus position detection according to a passive system on the basis of the image signals obtained from said image sensing unit, wherein said focus position detector, at the time of focus position detection according to the active system, acquires first image signals with said image sensing unit performing floodlighting with said floodlighting unit, acquires second image signals with said image sensing unit without performing the floodlighting with said floodlighting unit, and detects a focus position on the basis of differential signals between the first image signals and the second image signals; and
a control unit that prohibits output of the first image signals to a display unit.

3. The autofocus control apparatus according to claim 2 further comprising a unit that controls information indicating acquisition of the first image signals,
wherein said control unit controls to prohibit the output of the first image signals to said display unit according to the information.

4. An autofocus control apparatus in an image sensing apparatus that comprises: an optical system including a focus lens; an image sensing unit that photoelectrically converts light incident via said optical system into image signals and outputs the image signals; and a drive unit that drives said focus lens to adjust a focus position, said autofocus control apparatus comprising:
a floodlighting unit;
a focus position detector that performs focus position detection according to an active system and focus position detection according to a passive system on the basis of the image signals obtained from said image sensing unit, wherein said focus position detector, at the time of focus position detection according to the active system, acquires first image signals with said image sensing unit performing floodlighting with said floodlighting unit, acquires second image signals with said image sensing unit without performing the floodlighting with said floodlighting unit, and detects a focus position on the basis of differential signals between the first image signals and the second image signals;

a first memory that stores the first image signals; and a second memory that stores the second image signals, wherein said second memory is connected to a display unit, and said first memory is not connected to said display unit.

5. An autofocus control apparatus in an image sensing apparatus that comprises: an optical system including a focus lens; an image sensing unit that photoelectrically converts light incident via said optical system into image signals and outputs the image signals; and a drive unit that drives said focus lens to adjust a focus position, said autofocus control apparatus comprising:

a floodlighting unit; and a focus position detector that performs focus position detection according to an active system and focus position detection according to a passive system on the basis of the image signals obtained from said image sensing unit, wherein said focus position detector, at the time of focus position detection according to the active system, acquires first image signals with said image sensing unit performing floodlighting with said floodlighting unit, acquires second image signals with said image sensing unit without performing the floodlighting with said floodlighting unit, and detects a focus position on the basis of differential signals between the first image signals and the second image signals, and wherein said floodlighting unit irradiates an infrared ray, and said image sensing unit is covered by a color separation filter, and the first image signals are of pixels of said image sensing unit that corresponds to a color element with a high transmissivity of an infrared ray among color elements of said color separation filter.

6. An autofocus control method in an image sensing apparatus that comprises: an optical system including a focus lens: an image sensing unit that photoelectrically converts light incident performing focus position detection according to an active system on the basis of the image signals obtained from said image sensing unit;

performing focus position detection according to a passive system on the basis of the image signals obtained from said image sensing unit, wherein, in performing the focus position detection according to the active system, acquiring first image signals with said image sensing unit performing floodlighting with said floodlighting unit; acquiring second image signals with said image sensing unit without performing the floodlighting with said floodlighting unit; and detecting a focus position on the basis of differential signals between the first image signals and the second image signals; and prohibiting output of the first image signals to a display unit.

7. An autofocus control method in an image sensing apparatus that comprises: an optical system including a focus lens: an image sensing unit that photoelectrically converts light incident via said optical system into image signals and outputs the image signals; and a floodlighting unit, said autofocus control method comprising:

performing focus position detection according to an active system on the basis of the image signals obtained from said image sensing unit;

performing focus position detection according to a passive system on the basis of the image signals obtained from said image sensing unit, wherein, in performing the focus position detection according to the active system, acquiring first image signals with said image sensing unit performing floodlighting with said floodlighting unit; acquiring second image signals with said image sensing unit without performing the floodlighting with said floodlighting unit; and detecting a focus position on the basis of differential signals between the first image signals and the second image signals;

storing the first image signals in a first memory that is not connected to a display unit; and storing the second image signals in a second memory that is connected to the display unit.

8. The autofocus control method according to claim 7 further comprising adding information indicating acquisition of the first image signals; and controlling to prohibit the output of the first image signals to said display unit according to the information.

9. An autofocus control method in an image sensing apparatus that comprises: an optical system including a focus lens: an image sensing unit that photoelectrically converts light incident via said optical system into image signals and outputs the image signals; and a floodlighting unit, said autofocus control method comprising:

via said optical system into image signals and outputs the image signals; and a floodlighting unit, said autofocus control method comprising:

performing focus position detection according to an active system on the basis of the image signals obtained from said image sensing unit; and performing focus position detection according to a passive system on the basis of the image signals obtained from said image sensing unit, wherein, in performing the focus position detection according to the active system, acquiring first image signals with said image sensing unit performing floodlighting with said floodlighting unit;

acquiring second image signals with said image sensing unit without performing the floodlighting with said floodlighting unit; and detecting a focus position on the basis of differential signals between the first image signals and the second image signals, and wherein the first image signals are of a predetermined one row or one column of said image sensing unit, and the differential signals are of the one row or one column.

10. An autofocus control method in an image sensing apparatus that comprises: an optical system including a focus lens; an image sensing unit that photoelectrically converts light incident via said optical system into image signals and outputs the image signals; and a floodlighting unit, said autofocus control method comprising:

performing focus position detection according to an active system on the basis of the image signals obtained from said image sensing unit; and performing focus position detection according to a passive system on the basis of the image signals obtained from said image sensing unit, wherein, in performing the focus position detection according to the active system, acquiring first image signals with said image sensing unit performing floodlighting with said floodlighting unit; acquiring second image signals with said image sensing unit without performing the floodlighting with said floodlighting unit; and detecting a focus position on the basis of differential signals between the first image signals and the second image signals, and wherein said floodlighting unit irradiates an infrared ray, and said image sensing unit is covered by a color separation filter, said method further comprising acquiring the first image signals from signals of pixels of said image sensing unit that corresponds to a color element with a high transmissivity of an infrared ray among color elements of said color separation filter.

* * * * *

UNITED STATES PATENT AND TRADEMARK OFFICE
CERTIFICATE OF CORRECTION

PATENT NO. : 7,053,350 B2  Page 1 of 1
APPLICATION NO. : 11/225049
DATED : May 30, 2006
INVENTOR(S) : Konishi It is certified that error appears in the above-identified patent and that said Letters Patent is hereby corrected as shown below:

Column 25, Line 42, insert --via said optical system into image signals and outputs the image signals; and a floodlighting unit, said autofocus control method comprising:--.

Signed and Sealed this

Seventh Day of November, 2006

JON W. DUDAS
*Director of the United States Patent and Trademark Office*